United States Patent
Yamaguchi

(10) Patent No.: US 7,542,532 B2
(45) Date of Patent: Jun. 2, 2009

(54) DATA TRANSMISSION DEVICE AND INPUT/OUTPUT INTERFACE CIRCUIT

(75) Inventor: Hisakatsu Yamaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 643 days.

(21) Appl. No.: 10/801,610

(22) Filed: Mar. 17, 2004

(65) Prior Publication Data

US 2004/0252802 A1 Dec. 16, 2004

(30) Foreign Application Priority Data

Jun. 13, 2003 (JP) ............................. 2003-169872

(51) Int. Cl.
*H04L 7/00* (2006.01)
*G01R 29/26* (2006.01)
*G06F 11/24* (2006.01)

(52) U.S. Cl. ...................... 375/354; 702/69; 713/503

(58) Field of Classification Search ................ 375/354, 375/371, 226, 326, 373; 370/516, 518; 702/69; 713/500, 503

See application file for complete search history.

(56) References Cited

U.S. PATENT DOCUMENTS

| | | | | |
|---|---|---|---|---|
| 4,215,348 A | * | 7/1980 | Cordaro et al. ............. 370/324 |
| 4,544,927 A | * | 10/1985 | Kurth et al. ................ 342/373 |
| 4,630,282 A | * | 12/1986 | Landers et al. ............... 375/132 |
| 5,126,946 A | * | 6/1992 | Ko .............................. 700/66 |
| 5,504,726 A | * | 4/1996 | Semba ................... 369/44.28 |
| 5,557,196 A | | 9/1996 | Ujiie |
| 5,625,652 A | * | 4/1997 | Petranovich ................ 375/355 |
| 5,793,822 A | * | 8/1998 | Anderson et al. ........... 375/371 |
| 5,909,470 A | * | 6/1999 | Barratt et al. ............... 375/324 |
| 6,169,742 B1 | * | 1/2001 | Chow et al. ................. 370/402 |
| 6,272,138 B1 | * | 8/2001 | Weon .................... 370/395.62 |
| 6,337,657 B1 | * | 1/2002 | Zhodzishsky et al. .. 342/357.02 |
| 6,356,862 B2 | * | 3/2002 | Bailey ........................ 703/16 |
| 6,377,683 B1 | * | 4/2002 | Dobson et al. ......... 379/406.12 |
| 6,400,715 B1 | * | 6/2002 | Beaudoin et al. ........... 370/392 |
| 6,640,194 B2 | * | 10/2003 | Little et al. .................... 702/74 |
| 6,768,780 B1 | * | 7/2004 | Lakkis et al. ............... 375/355 |
| 6,791,623 B1 | * | 9/2004 | Masuda et al. .............. 348/563 |
| 6,791,995 B1 | * | 9/2004 | Azenkot et al. ............. 370/436 |
| 7,135,903 B2 | * | 11/2006 | Kizer et al. .................. 327/159 |
| 2002/0012343 A1 | * | 1/2002 | Holloway et al. ........... 370/389 |
| 2002/0057713 A1 | * | 5/2002 | Bagchi et al. ............... 370/468 |
| 2002/0061082 A1 | * | 5/2002 | Balakrishnan et al. ...... 375/355 |
| 2002/0094048 A1 | * | 7/2002 | Simmons et al. ............ 375/362 |
| 2002/0103618 A1 | * | 8/2002 | Schleifer et al. ............ 702/176 |
| 2002/0181622 A1 | * | 12/2002 | Boutros et al. .............. 375/343 |
| 2002/0186677 A1 | * | 12/2002 | Leung ........................ 370/342 |

(Continued)

FOREIGN PATENT DOCUMENTS

| | | |
|---|---|---|
| JP | 63-179616 | 7/1988 |
| JP | 01235437 A | 9/1989 |
| JP | 01241945 A | 9/1989 |
| JP | 04220045 A | 8/1992 |

(Continued)

*Primary Examiner*—Young T. Tse
(74) *Attorney, Agent, or Firm*—Arent Fox LLP

(57) ABSTRACT

A clock generator supplies a clock signal to a data transmission circuit for a jitter resistance test of a data transmission/reception circuit, while supplying a clock signal to a data reception circuit. At this time, the clock signal supplied by the clock generator to the data transmission circuit is allowed to include jitter of the modulation frequency and depth based on various types of setting signals. A signal is at the H level during the test.

6 Claims, 17 Drawing Sheets

U.S. PATENT DOCUMENTS

| | | | |
|---|---|---|---|
| 2003/0016169 A1* | 1/2003 | Jandrell | 342/357.12 |
| 2003/0048500 A1* | 3/2003 | Fala et al. | 359/110 |
| 2003/0093715 A1* | 5/2003 | Hasako et al. | 714/25 |
| 2003/0174690 A1* | 9/2003 | Benveniste | 370/350 |
| 2003/0215002 A1* | 11/2003 | Gorday et al. | 375/147 |
| 2004/0047319 A1* | 3/2004 | Elg | 370/338 |
| 2004/0057542 A1* | 3/2004 | Knapp et al. | 375/355 |
| 2004/0058653 A1* | 3/2004 | Dent | 455/69 |
| 2005/0031097 A1* | 2/2005 | Rabenko et al. | 379/93.31 |

FOREIGN PATENT DOCUMENTS

| | | |
|---|---|---|
| JP | 05-235718 | 9/1993 |
| JP | 05-037311 | 12/1993 |
| JP | 07-083980 | 3/1995 |

* cited by examiner

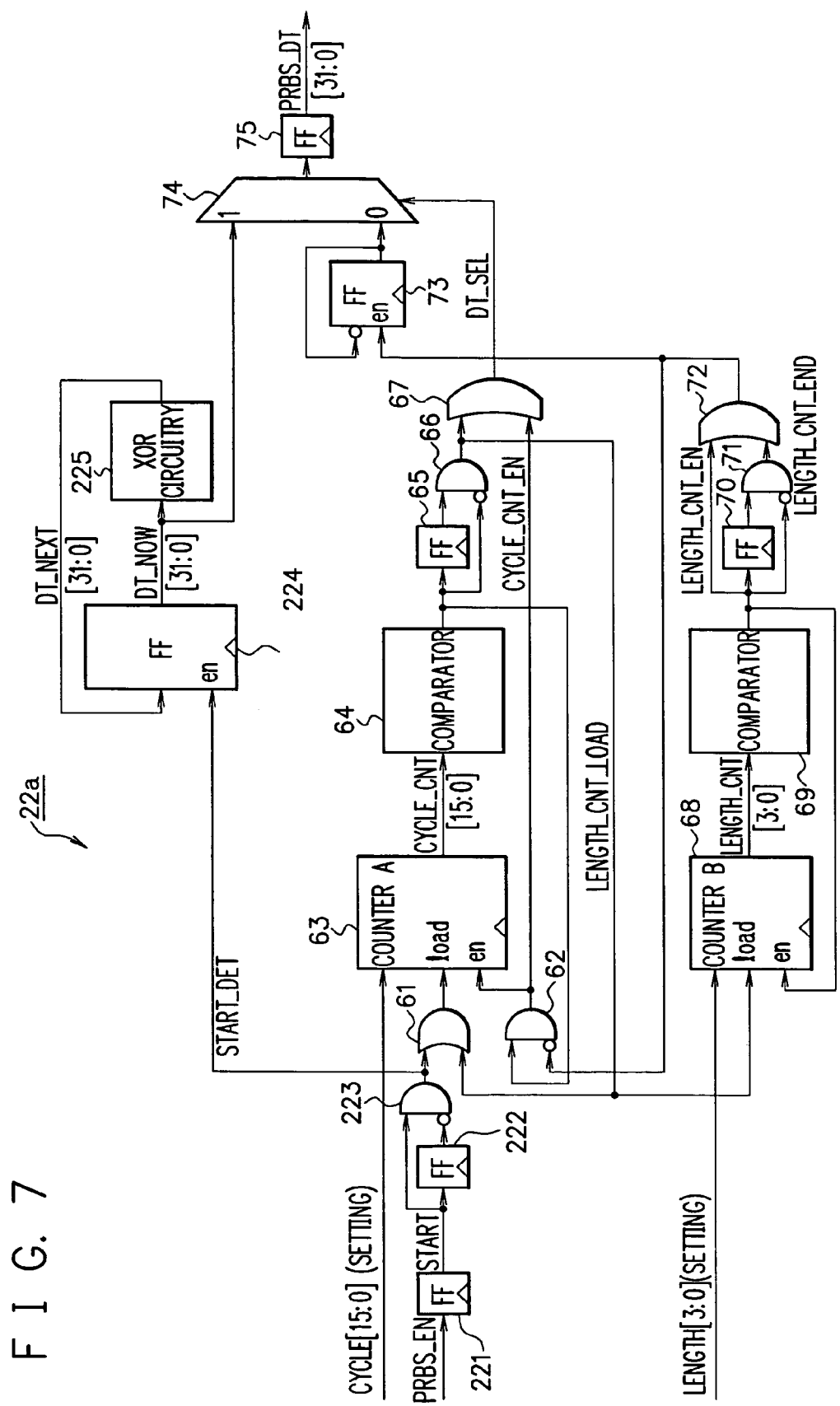
F I G. 7

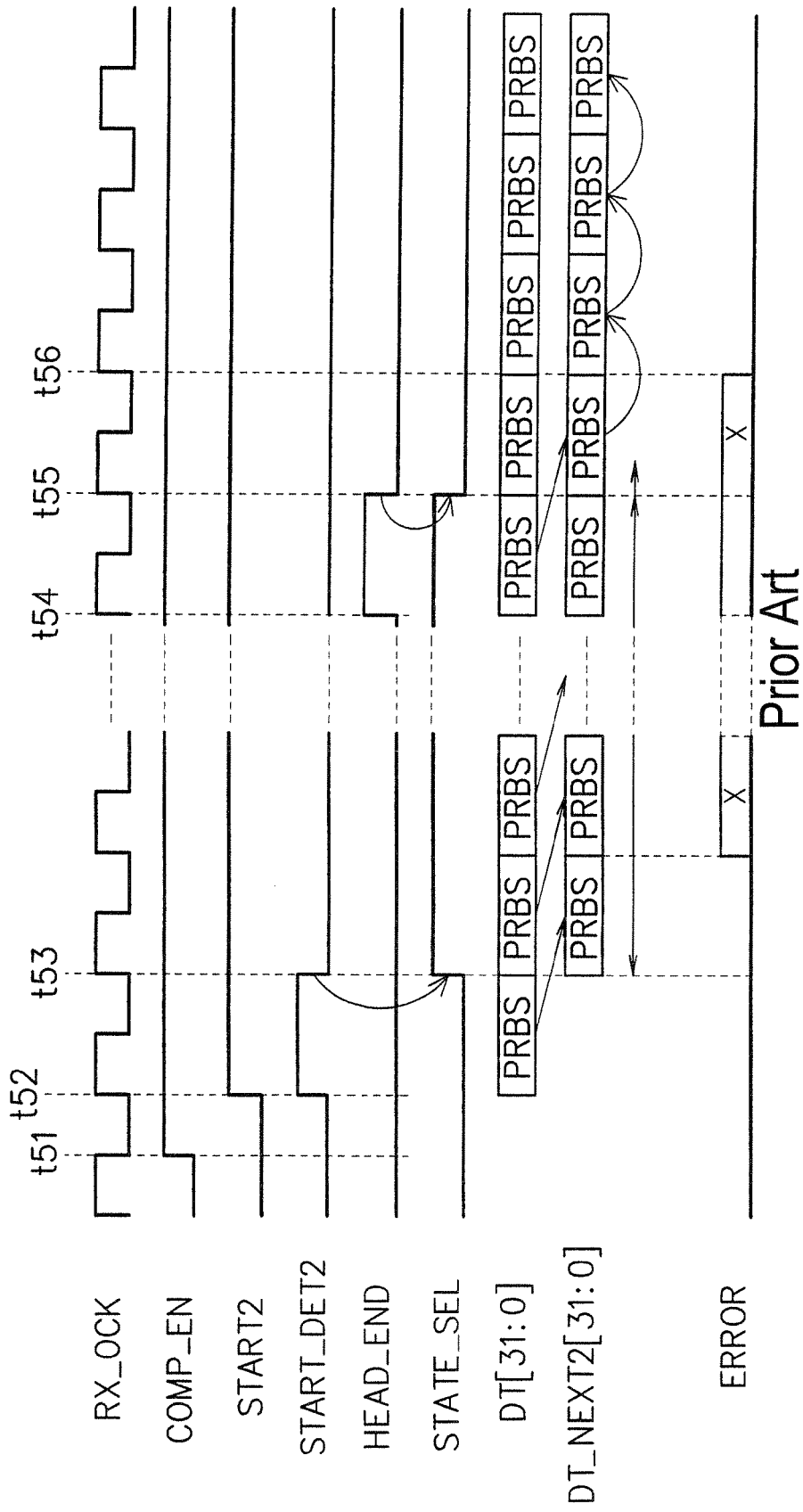

DATA TRANSMISSION DEVICE AND INPUT/OUTPUT INTERFACE CIRCUIT

CROSS-REFERENCE TO RELATED APPLICATIONS

This application is based upon and claims the benefit of priority from the prior Japanese Patent Application No. 2003-169872, filed on Jun. 13, 2003, the entire contents of which are incorporated herein by reference.

BACKGROUND OF THE INVENTION

1. Field of the Invention

The present invention relates to a data transmission device and an input/output (I/O) interface circuit with a data transmission circuit which enable testing of jitter tolerance upon transmitting or receiving data between LSIs (Large-Scale Integrated Circuits), between a plurality of elements or circuit blocks in an LSI chip, or between printed circuit boards or device housings.

2. Description of the Related Art

In general, data to be transmitted or received between circuit blocks, between chips, or in a device housing includes jitter (phase variations) depending on the service environment such as their transmission line characteristics. To properly identify the data that includes jitter, the data reception circuit is provided with a clock recovery circuit. Many standards set for data transmission and reception define jitter tolerance (resistance to jitter) as the minimum amount of jitter at which the data reception circuit has to correctly identify data. Thus, the jitter tolerance should be inevitably satisfied in the design of data transmission and reception. On the other hand, the jitter tolerance can be measured to thereby evaluate the performance of the data reception circuit.

More specifically, to test a circuit terminating device used in the integrated services digital network, a method for jitter superposition has been disclosed which enables superimposing of a predetermined jitter on an input signal supplied to the circuit terminating device, thereby testing its capability of receiving the signal superimposed with the predefined jitter without any error (e.g., see Patent Document 1). Also disclosed is a packet tester with a delay jitter inserter which can add both a lagging jitter and a leading jitter to a transmitted packet, thereby allowing a delay jitter associated with a nearly actual state of the network to be added to the packet (e.g., see Patent Documents 2 and 3).

However, the jitter tolerance of the aforementioned data transmission/reception circuit cannot be evaluated during its mass production test. This is because the mass production test cannot employ an expensive system from the viewpoint of cost, making it impractical to construct a separate system for generating transmitted/received data that includes the jitter intended by the observer. For example, in the conventional mass production test, the data reception circuit is tested using a loop structure through which data transmitted by the data transmission circuit is directly supplied to the data reception circuit. FIG. 11 is a view illustrating a loop structure for testing the data transmission/reception circuit (the I/O interface circuit).

Referring to FIG. 11, a data transmission/reception circuit 1 includes a data transmission circuit 2 for delivering serial data TXRX_DT, a data reception circuit 3 for receiving the serial data TXRX_DT delivered by the data transmission circuit 2, and a clock generator 4 for delivering a clock signal TX_CK and a clock signal RX_CK to the data transmission circuit 2 and the data reception circuit 3, respectively, based on a reference clock signal REF_CK.

More specifically, the clock generator 4 shown in FIG. 11 delivers the clock signal TX_CK having a frequency of 5 GHz (Gigaherz) to the data transmission circuit 2 as well as the clock signal RX_CK having the same frequency of 5 GHz to the data reception circuit 3, based on the reference clock signal REF_CK having a frequency of 625 MHz (Megahertz). The data transmission circuit 2 and the data reception circuit 3 exchange the serial data TXRX_DT therebetween at a transmission rate of 10 Gbps (bits per second).

Now, the internal configuration of the data transmission circuit 2 will be described below. As shown in FIG. 11, the data transmission circuit 2 includes a clock controller 21, a PRBS (Pseudo Random Bit Sequence) pattern generator 22, selectors 23, 24, a 32:4 converter 25, and a driver circuit 26. The clock controller 21 receives the clock signal TX_CK having a frequency of 5 GHz from the clock generator 4 and then delivers 4-bit 2.5 GHz clock signals TX_DCK having four types of phases, each shifted successively by 90 degrees, to the 32:4 converter 25 and the driver circuit 26.

The 4-bit clock signals TX_DCK are defined as TX_DCK_A, TX_DCK_B, TX_DCK_C, and TX_DCK_D, respectively. The clock controller 21 also frequency divides the clock signal TX_CK by a factor of 16 to deliver the resulting clock signal CLK having a frequency of 312.5 MHz to the PRBS pattern generator 22.

In sync with the clock signal CLK delivered by the clock controller 21, the PRBS pattern generator 22 generates and outputs a pseudo random pattern of 32-bit data PRBS_DT [31:0] for testing the data transmission/reception circuit 1. The PRBS pattern generator 22 is activated when an enable signal PRBS_EN is at a H (high) level. The enable signal PRBS_EN is at a L (low) level when the data transmission/reception circuit 1 operates in a normal mode, but at the H level in a test mode. The PRBS pattern generator 22 will be discussed in detail later.

The selectors 23, 24 switch the signal to be supplied to the 32:4 converter 25 depending on the mode of operation of the data transmission circuit, i.e., between the test and normal modes. More specifically, in the normal mode, the selector 23 selects a clock signal USER_CK externally provided at a given frequency to deliver it to the 32:4 converter 25 as a clock signal TX_ICK. In the test mode, the selector 23 selects a clock signal PRBS_CK supplied by the PRBS pattern generator 22 to deliver it to the 32:4 converter 25 as the clock signal TX_ICK. On the other hand, the selector 24 selects, in the normal mode, arbitrary 32-bit data USER_DT [31:0] provided externally to deliver it as data TX_IDT [31:0] to the 32:4 converter 25. In the test mode, the selector 24 selects the 32-bit data PRBS_DT [31:0] supplied by the PRBS pattern generator 22 to deliver it to the 32:4 converter 25 as the data TX_IDT [31:0].

Then, the 32:4 converter 25 converts the 32-bit data TX_IDT [31:0] received into 4-bit data TX_DT [3:0] to deliver the resulting data to the driver circuit 26. More specifically, the 32:4 converter 25 captures the 32-bit data TX_IDT [31:0] in sync with the clock signal TX_ICK of 312.5 MHz to convert the data in width from 32 bits to 4 bits, and then delivers the resulting 4-bit data TX_DT [3:0] in sync with each of the 4-bit clock signals TX_DCK of 2.5 GHz. The 4-bit data TX_DT [3:0] is defined as TX_DT_A, TX_DT_B, TX_DT_C, and TX_DT_D.

The driver circuit 26 then converts the 4-bit data TX_DT [3:0] to 1-bit serial data TXRX_DT for output. More specifically, the driver circuit 26 uses the 4-bit clock signals TX_DCK having different phases to convert the 4-bit data TX_DT [3:0] to the 1-bit serial data TXRX_DT for output at a transmission rate of 10 Gbps.

Arranged as described above, in the test mode, the data transmission circuit 2 converts the 312.5 Mbps 32-bit data PRBS_DT, generated by the PRBS pattern generator 22 for use with testing, to the 10 Gbps 1-bit serial data TXRX_DT for output.

Now, the internal configuration of the data reception circuit 3 will be described below. As shown in FIG. 11, the data reception circuit 3 includes a clock controller 31, a receiver circuit 32, a 4:32 converter 33, and a pattern comparator 34. The clock controller 31 receives the clock signal RX_CK having a frequency of 5 GHz from the clock generator 4 to deliver 4-bit clock signals RX_DCK having four types of phases, each shifted successively by 90 degrees at a frequency of 2.5 GHz, to the 4:32 converter 33 and the receiver circuit 32. The 4-bit clock signals RX_DCK are defined as RX_DCK_A, RX_DCK_B, RX_DCK_C, and RX_DCK_D, respectively.

The receiver circuit 32 receives the serial data TXRX_DT transmitted by the data transmission circuit 2 to output 4-bit received data RX_DT [3:0] and RX_BDT [3:0]. More specifically, the receiver circuit 32 receives the 10 Gbps 1-bit serial data TXRX_DT at the timing of the 4-bit clock signals RX_DCK having different phases to output the 4-bit 2.5 Gbps received data RX_DT [3:0] and RX_BDT [3:0]. The received data RX_DT [3:0] is provided by capturing each piece of the 1-bit serial data TXRX_DT at a positively receivable timing and converting it into 4-bit data. On the other hand, the received data RX_BDT [3:0] is provided by capturing the serial data TXRX_DT at a point of change in time of each piece thereof and then converting it into 4-bit data.

The 4:32 converter 33 converts the 4-bit received data RX_DT [3:0] and RX_BDT [3:0], supplied by the receiver circuit 32, to 32-bit received data RX_ODT [31:0] and RX_OBDT [31:0] for output. More specifically, the 4:32 converter 33 captures the 2.5 Gbps 4-bit received data RX_DT [3:0] and RX_BDT [3:0] supplied by the receiver circuit 32, in response to the 4-bit clock signals RX_DCK supplied by the clock controller 31, and then converts the captured data to the 312.5 Mbps 32-bit received data RX_ODT [31:0] and RX_OBDT [31:0] for output. The received data RX_ODT [31:0] is supplied to the pattern comparator 34 and a filter 35. On the other hand, the received data RX_OBDT [31:0] is supplied to the filter 35. The 4:32 converter 33 also frequency divides the clock signals RX_DCK of 2.5 GHz by a factor of 8 to create a 312.5 MHz clock signal RX_OCK, which is then delivered to the pattern comparator 34 and the filter 35.

The pattern comparator 34 compares the received data RX_ODT [31:0] delivered by the 4:32 converter 33 with an expectation value, thereby outputting an error flag ERROR serving as a signal for detecting an error upon reception. More specifically, the pattern comparator 34 captures the 32-bit received data RX_ODT [31:0], delivered by the 4:32 converter 33, in sync with the clock signal RX_OCK delivered also by the 4:32 converter 33 to compare the captured data with an expectation value. The pattern comparator 34 is activated when an enable signal COMP_EN is at the H level. The enable signal COMP_EN is at the L level when the data transmission/reception circuit 1 operates in the normal mode, but at the H level in the test mode. The pattern comparator 34 will be discussed in detail later.

The filter 35 outputs a signal PI_CODE for adjusting a phase shift in the clock signals RX_DCK from the clock controller 31 in accordance with the received data RX_ODT [31:0] and RX_OBDT [31:0] delivered by the 4:32 converter 33. For example, when the serial data signal TXRX_DT is being captured at the rising edge of the clock signal RX_DCK, this allows for controlling the operation of the clock controller 31 such that the rising edge of the clock signal RX_DCK lies at the midpoint of change in each serial data signal TXRX_DT (at a timing at which data can be positively captured).

Now, an exemplary conventional circuit configuration of the clock generator 4 shown in FIG. 11 is described below.

FIG. 12 is a view illustrating an exemplary conventional circuit configuration of the clock generator 4 shown in FIG. 11. As shown in FIG. 12, the clock generator 4 includes a phase comparator 41, a filter 42, a VCO (Voltage Controlled Oscillator) 43, a frequency divider 44; and buffers 45, 46. In this arrangement, the phase comparator 41, the filter 42, the VCO 43, and the frequency divider 44 obviously constitute a PLL (Phase Locked Loop), allowing for delivering the clock signals TX_CK and RX_CK, having a frequency of 5 GHz or an eight-fold frequency, with stable phases in accordance with the reference clock signal REF_CK of 625 MHz.

Now, an exemplary conventional circuit configuration of the PRBS pattern generator 22 shown in FIG. 11 will be described below.

FIG. 13 is a view illustrating an exemplary conventional circuit configuration of the PRBS pattern generator 22 shown in FIG. 11. As shown in FIG. 13, the conventional PRBS pattern generator 22 is made up of flip-flops 221, 222, a logic element 223, a flip-flop 224 with an enable function, XOR (exclusive logical sum) circuitry 225, and buffers 226, 227.

The flip-flop 221 latches an external enable signal PRBS_EN at the rising edge of the clock signal CLK and then delivers the resulting signal as a signal START to the input terminal of the flip-flop 222 and a first input terminal of the logic element 223. The flip-flop 222 latches the signal START from the flip-flop 221 at the rising edge of the clock signal CLK and then supplies the resulting signal to a second input terminal of the logic element 223. The logic element 223 delivers a signal START_DET which is AND (logical product) of the signal START supplied to the first input terminal, and the complement of the signal supplied to the second input terminal.

The enable terminal en of the flip-flop 224 with an enable function (hereinafter referred to as the enable FF) 224 is supplied with the signal START_DET delivered by the logic element 223. The enable FF 224 is activated when the signal START_DET changes from the H level to the L level. Additionally, the input terminal of the enable FF 224 is supplied with data DT_NEXT [31:0] delivered by the XOR circuitry 225. Furthermore, the enable FF 224 delivers data DT_NOW [31:0] to the input terminal of the XOR circuitry 225. Still furthermore, the data DT_NOW [31:0] provided by the enable FF 224 is delivered to an external circuit as the data (PRBS pattern) PRBS_DT [31:0] via the buffer 226.

The flip-flops 221, 222 and the enable FF 224 are supplied with the clock signal CLK at their clock terminals. The clock signal CLK is also delivered as the clock signal PRBS_CK via the buffer 227. The flip-flops 221, 222 and the logic element 223 constitutes a rising-edge detector circuit. The rising-edge detector circuit generates the signal START_DET which rises in response to the rising edge of the enable signal PRBS_EN.

The aforementioned arrangement allows the PRBS pattern generator 22 to deliver the PRBS pattern which is generated by the XOR circuitry 225, in response to the rising edge of the enable signal PRBS_EN.

Now, a detailed exemplary circuit configuration of the XOR circuitry 225 shown in FIG. 13 will be explained below.

FIG. 14 is a view illustrating a detailed exemplary circuit configuration of the XOR circuitry 225 shown in FIG. 13. As shown in FIG. 14, the XOR circuitry 225 includes XORs (exclusive ORs) 252 to 261, with a 32-bit input terminal 251 and a 32-bit output terminal 262. The input terminal 251 is supplied with the current data DT_NOW [31:0] from the enable FF 224 shown in FIG. 13. This allows the XOR circuitry 225 to generate the next cycle data DT_NEXT [31:0], which is in turn delivered from the output terminal 262. The connection arrangement of the XORs 252 to 261 for connecting between the input terminal 251 and the output terminal 262 is adapted to generate the PRBS pattern. In addition, the aforementioned PRBS pattern, part of which is received by the reception side, thereby allows an expectation value of the subsequently received signal to be generated.

Now, the operation of the PRBS pattern generator 22 shown in FIG. 13 will be explained briefly. FIG. 15 is an explanatory waveform diagram illustrating the operation of the PRBS pattern generator 22 shown in FIG. 13. As shown in FIG. 15, the clock signal CLK is supplied to the PRBS pattern generator 22. First, at time t41, the enable signal PRBS_EN rises. Then, at time t42, the flip-flop 221 latches the enable signal PRBS_EN in sync with the rising edge of the clock signal CLK, thereby allowing the signal START to rise to the H level. This also allows the signal START_DET delivered by the logic element 223 to rise to the H level as well as the enable FF 224 to be inactivated.

Then, at time t43, when the clock signal CLK has risen, the flip-flop 222 changes its output to the H level, causing the signal START_DET delivered by the logic element 223 to fall to the L level. This causes the enable FF 224 to be activated, capture the DT_NEXT [31:0] in sync with the rising edge of the clock signal CLK, and then deliver the captured data as the DT_NOW [31:0]. This allows the buffer 226 to output the DT_NOW [31:0] as the PRBS pattern PRBS_DT [31:0]. As described above, the PRBS pattern generator 22 generates the PRBS pattern PRBS_DT [31:0] in sync with the clock signal CLK for output.

Now, an exemplary conventional circuit configuration of the pattern comparator 34 shown in FIG. 11 will be described below.

FIG. 16 is a view illustrating an exemplary conventional circuit configuration of the pattern comparator 34 shown in FIG. 11. As shown in FIG. 16, the conventional pattern comparator 34 is made up of flip-flops 341, 343, 347 to 349, a selector 342, XOR (exclusive OR) circuitry 344, a comparator 345, a demultiplexer 346, a logic element 350, and a sequencer 351.

The flip-flop 341 captures the data RX_ODT [31:0], supplied by the 4:32 converter 33, at the rising edge of the clock signal RX_OCK to deliver it as data DT [31:0]. The selector 342 selectively outputs the data DT [31:0] delivered by the flip-flop 341 or the data DT_NEXT 2 [31:0] delivered by the XOR circuitry 344 to the flip-flop 343. At this time, the selector 342 performs the aforementioned selection in response to a control signal STATE_SEL from the sequencer 351.

The flip-flop 343 delivers the data, supplied by the selector 342, to the XOR circuitry 344 as data DT_NOW 2 [31:0] in response to the rising edge of the clock signal RX_OCK. The XOR circuitry 344 delivers data DT_NEXT 2 [31:0] in accordance with the data DT_NOW 2 [31:0] supplied by the flip-flop 343. The data DT_NEXT 2 [31:0] delivered by the XOR circuitry 344 is also supplied to the first input terminal of the comparator 345 as expectation value data. The data DT [31:0] delivered by the flip-flop 341 is also supplied to the second input terminal of the comparator 345 as received data.

The comparator 345 compares the expectation value data (data DT_NEXT 2 [31:0]) with the received data (data DT [31:0]) to output the result of the comparison. The comparator 345 outputs the L level if the comparison result exhibits a match, and the H level if it exhibits no match. The demultiplexer 346 delivers the signal, supplied by the comparator 345, to the destination that has been selected in accordance with the control signal STATE_SEL delivered by the sequencer 351. More specifically, the demultiplexer 346 selects the flip-flop 347 as the destination when the control signal STATE_SEL is at the L level, while selecting the sequencer 351 as the destination when the control signal STATE_SEL is at the H level. The flip-flop 347 captures the signal, supplied by the comparator 345 via the demultiplexer 346, at the rising edge of the clock signal RX_OCK to output the error flag ERROR serving as an error detection signal.

The flip-flop 348 latches the enable signal COMP_EN supplied externally in response to the rising edge of the clock signal RX_OCK to output it as the signal START 2 to the input terminal of the flip-flop 349 and the first input terminal of the logic element 350. The flip-flop 349 latches a signal START 2, delivered by the flip-flop 348, at the rising edge of the clock signal RX_OCK to output it to the second input terminal of the logic element 350. The logic element 350 delivers a signal START_DET 2 which is AND of the signal START 2 supplied to the first input terminal, and the complement of the signal supplied to the second input terminal.

The enable terminal en of the sequencer 351 is supplied with the signal START_DET 2 delivered by the logic element 350. Additionally, the input terminal of the sequencer 351 is supplied with a signal CMP_FLAG delivered by the demultiplexer 346. In accordance with the signal START_DET 2, the sequencer 351 also outputs the control signal STATE_SEL which is at the H level for a certain period of time.

The clock terminal of the flip-flops 341, 343, 347 to 349 and the sequencer 351 is supplied with the clock signal RX_OCK. The circuit configuration of the XOR circuitry 344 is the same as the detailed exemplary circuit configuration of the XOR circuitry 225 shown in FIG. 13. The flip-flops 348, 349 and the logic element 350 constitute a rising-edge detector circuit. That is, this rising-edge detector circuit outputs the signal START_DET 2, i.e., a pulsed signal which rises upon detecting the rising edge of the enable signal COMP_EN.

The aforementioned arrangement allows the pattern comparator 34 to compare the received data and the expectation value data to output the error flag ERROR in response to the rising edge of the enable signal COMP_EN.

Now, the operation of the pattern comparator 34 shown in FIG. 16 will be explained briefly. FIG. 17 is an explanatory waveform diagram illustrating the operation of the pattern comparator 34 shown in FIG. 16. As shown in FIG. 17, the clock signal RX_OCK is supplied to the pattern comparator 34. First, at time t51, the enable signal COMP_EN rises. Then, at time t52, the flip-flop 348 latches the enable signal COMP_EN in response to the rising edge of the clock signal RX_OCK, thereby allowing the signal START 2 to rise to the H level. This allows the signal START_DET 2 delivered by the logic element 350 to be at the H level for the duration of one clock.

Then, at time t53, when the signal START_DET 2 has gone through the duration of the H level and fallen to the L level, the sequencer 351 raises the control signal STATE_SEL to the H level. This causes the selector 342 to output the data DT [31:0], delivered by the flip-flop 341, to the flip-flop 343. On the other hand, the demultiplexer 346 delivers the output signal, supplied by the comparator 345, to the sequencer 351 as the signal CMP_FLAG. Thus, the pattern comparator 34 is driven into a LOCK detection state which allows the XOR circuitry 344 to deliver an appropriate expectation value in accordance with received data RX_ODT [31:0].

Now, the LOCK detection state will be explained below. Suppose that patterns are compared at the receiving side. In this case, there are typically two states: the state of detecting the head of received data (LOCK detection state) and the error detection state. The control signal STATE_SEL shown in FIG. 16 provides control to either of the states. More specifically, the STATE_SEL being at the H level corresponds to the LOCK detection state, while the STATE_SEL being at the L level corresponds to the error detection state. During the LOCK detection state, the error flag ERROR is held at the L level.

In the LOCK detection state, the received data DT [31:0] is captured by the flip-flop 343 in every clock cycle and then employed as the initial value data DT_NOW 2 [31:0] for the XOR circuitry 344 to generate the expectation value data DT_NEXT 2 [31:0]. The comparator 345 compares the expectation value data DT_NEXT 2 [31:0] generated as such with the received data DT [31:0]. If the comparison results exhibit matches successively for several cycles in the comparator 345, the process interprets the state as locking (i.e., as being able to generate an appropriate expectation value) and then proceeds to the error detection state. The number of the aforementioned cycles is determined through the processing to be performed by the sequencer 351. More specifically, the sequencer 351 has a function of generating an internal signal HEAD_END, i.e., a pulsed signal which rises after predetermined several cycles have been counted from the falling edge of the signal START_DET 2. Now, referring to FIG. 17, how the process changes to the error detection state will be explained below.

At time t54, the sequencer 351 counts the number of predetermined several cycles, then allowing the internal signal HEAD_END to rise. Then, at time t55, the sequencer 351 causes the internal signal HEAD_END to fall, allowing the control signal STATE_SEL to fall correspondingly. Thus, the pattern comparator 34 is driven into the error detection state, thereby allowing the flip-flop 347 to start delivering the error flag ERROR in sync with the clock signal at time t56.

As described above, the mass production test employs the loop structure in which the transmitted data from the data transmission circuit 2 is directly supplied to the data reception circuit 3 in order to evaluate the transmission and reception function of the data transmission/reception circuit 1.

As described above, the clock controller 31 in the data reception circuit 3 adjusts the phase of the internal clock signal RX_DCK in accordance with the difference in phase between the received data TXRX_DT and the internal clock signal RX_DCK. However, without a change such as 0 to 1 or 1 to 0 in the received data TXRX_DT, it would be impossible to detect the difference between the received data TXRX_DT and the internal clock signal RX_DCK. For this reason, a typical communication standard specifies the length of data having no change as a 0 run length or a 1 run length. That is, the length of a contiguous sequence of data 0 (L level) is defined as a 0 run length, while the length of a contiguous sequence of data 1 (H level) is defined as a 1 run length. For example, the SONET standard defines 72 bits as the maximum length of a 0 run length or a 1 run length. In the data transmission/reception design, it is inevitable to meet jitter tolerance when such data as including a 0 run length or a 1 run length is used.

Prior Arts are disclosed in Patent Document 1 (Japanese Patent Application Laid-Open No. Hei 4-220045), Patent Document 2 (Japanese Patent Application Laid-Open No. Hei 1-241945), and Patent Document 3 (Japanese Patent Application Laid-Open No. Hei 1-235437).

However, in the aforementioned mass production test, the transmitted/received data TXRX_DT includes no jitter resulting from the environment in which the data transmission/reception circuit 1 would be used and no jitter corresponding to the jitter tolerance to be specified for the data transmission/reception circuit 1 in its design specifications. In other words, there is a problem of being unable to test jitter tolerance.

Furthermore, the modulation frequency and depth (the amount of modulation) of the jitter imposed on the clock signal need to be combined in a variety of ways to measure the aforementioned jitter tolerance characteristics. This has led to an increasing demand for automatic measurements.

In the aforementioned mass production test, there is also a problem of being unable to evaluate jitter tolerance using transmitted data including a 0 run length or a 1 run length.

SUMMARY OF THE INVENTION

The present invention was devised in view of the aforementioned problems. It is therefore an object of the invention to provide a data transmission device and an I/O interface circuit with a data transmission circuit, which enable testing of jitter tolerance upon transmitting or receiving data during a mass production test and provide improved failure detection power.

It is another object of the present invention to provide a data transmission device and an I/O interface circuit with a data transmission circuit, which enable automatic measurements on the characteristics of jitter tolerance in data transmission/reception.

It is still another object of the present invention to provide a data transmission device and an I/O interface circuit with a data transmission circuit, which enable testing of jitter tolerance upon transmitting or receiving data during a mass production test and provide improved failure detection power even when a 0 run length or a 1 run length is included in transmitted/received data.

The present invention was devised to solve the aforementioned problems. The data transmission device and the I/O interface circuit with a data transmission circuit according to the present invention include clock generation circuit generating a clock signal, and jitter supply circuit allowing the clock signal generated by the clock generation circuit to include jitter, the data transmission circuit being adapted to transmit data in sync with the clock signal including the jitter.

In the data transmission device and the I/O interface circuit with the data transmission circuit according to the present invention, this arrangement allows the clock signal supplied to the data transmission circuit to include jitter, and thereby the transmitted data delivered by the data transmission circuit to include jitter as well. This allows for checking whether the data reception circuit properly receives the transmitted data including jitter, thereby making it possible to test jitter tolerance.

BRIEF DESCRIPTION OF THE DRAWINGS

FIG. 7 is a view illustrating an exemplary internal configuration of the PRBS pattern generator 22*a* shown in FIG. 6;

FIG. 17 is an explanatory waveform diagram illustrating the operation of the pattern comparator 34 shown in FIG. 16.

DETAILED DESCRIPTION OF THE PREFERRED EMBODIMENTS

Now, the present invention will be explained below in accordance with the embodiments.

Figure 1:
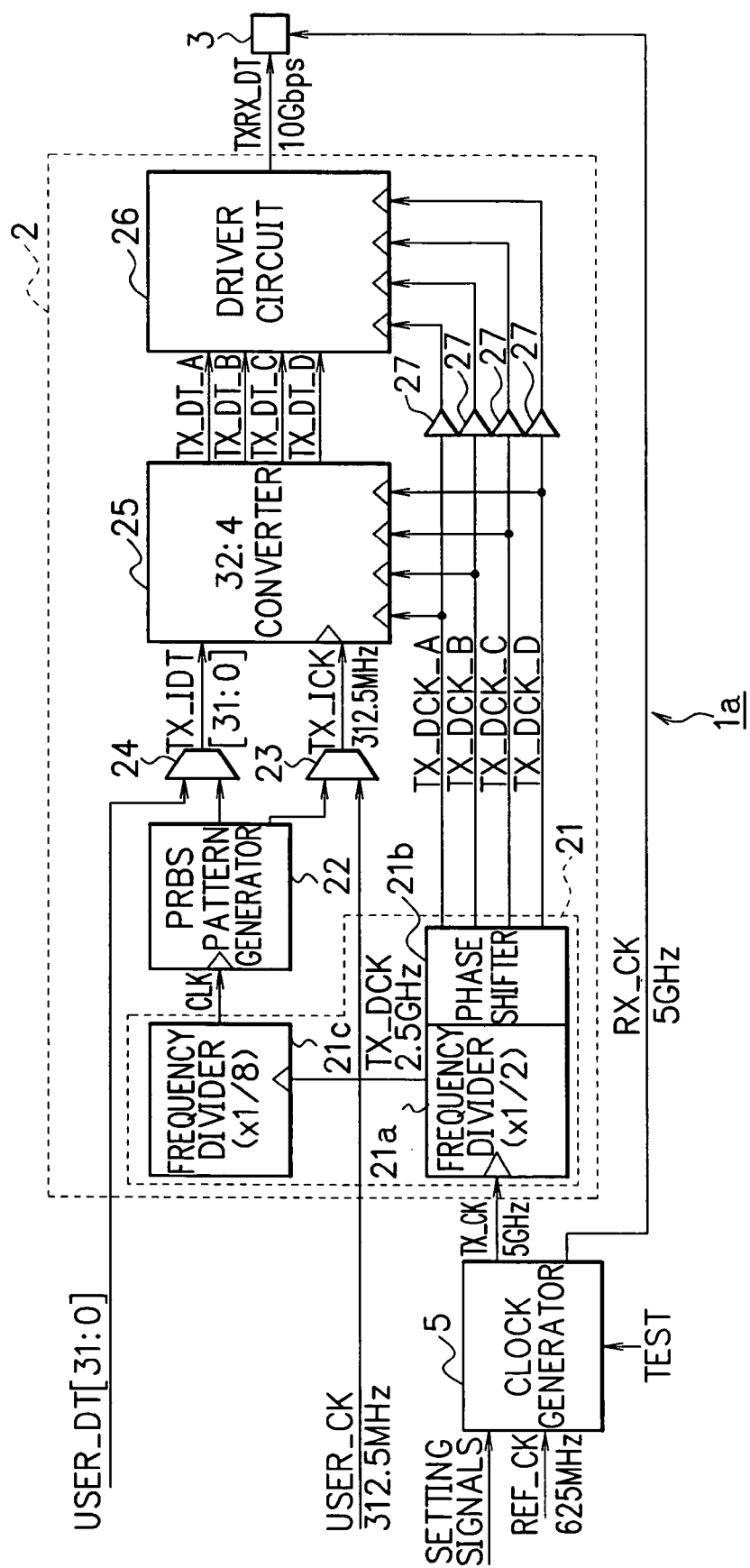
FIG. 1 is a view illustrating the overall configuration of a data transmission/reception circuit including a jitter test circuit according to a first embodiment of the present invention.

First, referring to the drawings, explained is the overall configuration of a data transmission/reception circuit (I/O interface circuit) which includes a jitter test circuit according to a first embodiment of the present invention. FIG. 1 is a view illustrating the overall configuration of the data transmission/reception circuit including the jitter test circuit according to the first embodiment of the present invention. In FIG. 1, the circuits indicated with the same reference symbols as those of FIG. 11 have the like function or configuration, which are not to be explained repeatedly. A data transmission/reception circuit 1*a* shown in FIG. 1 is different from the conventional data transmission/reception circuit 1 shown in FIG. 11 in having a clock generator 5. Unlike the clock generator 4 of FIG. 11, the clock generator 5 is able to output a clock TX_CK including jitter. The data transmission circuit 2 and the clock generator 5 constitute a data transmission device which can transmit data including jitter.

Figure 11:
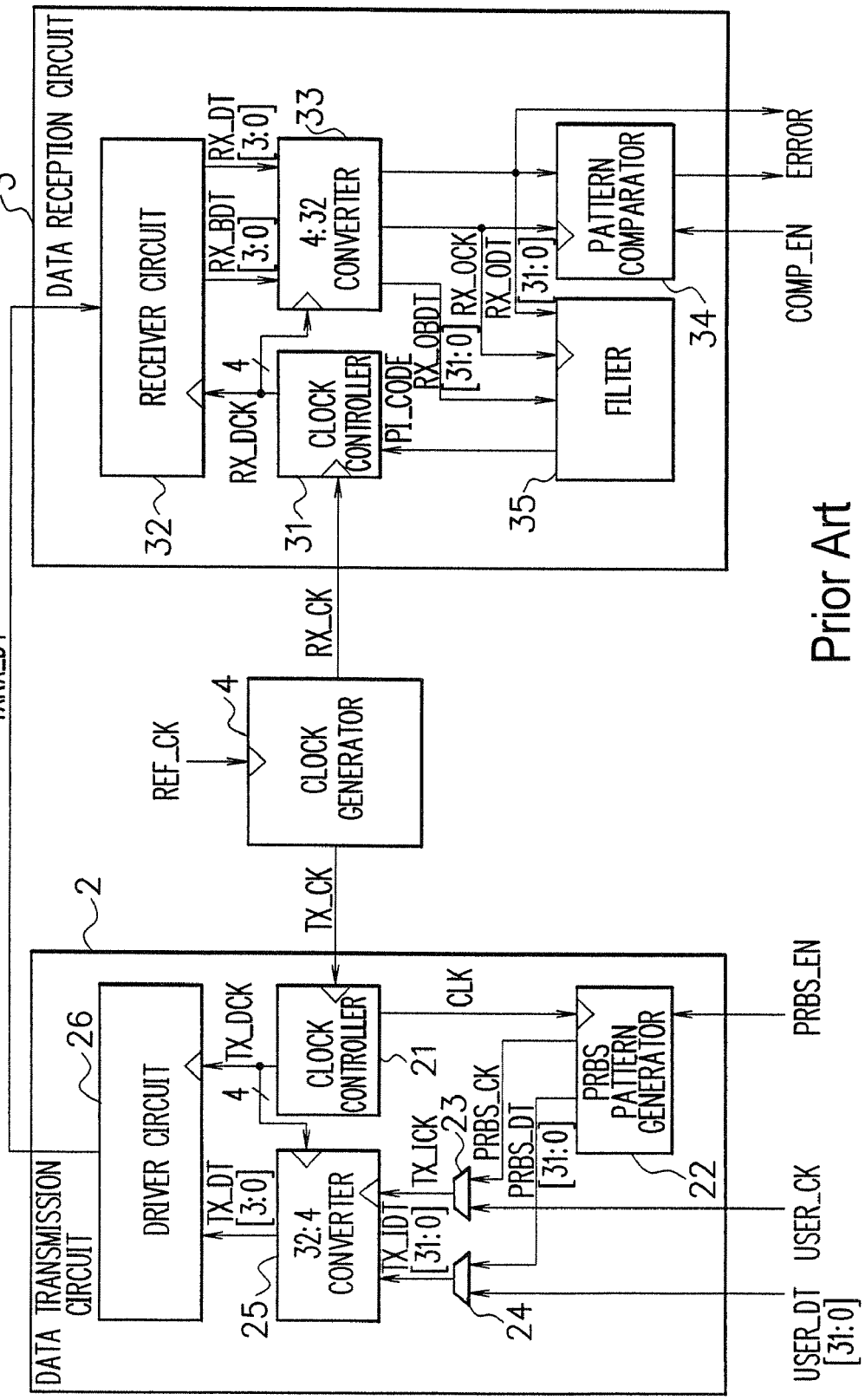
FIG. 11 is a view illustrating a loop structure for testing a data transmission/reception circuit.

Although not illustrated in FIG. 11, for example, the clock controller 21 includes a frequency divider 21*a* for dividing a frequency by a factor of 2, a phase shifter 21*b* for producing phase shifts of four types, and a frequency divider 21*c* for dividing a frequency by a factor of 8, as shown in FIG. 1. This arrangement allows the frequency divider 21*a* to divide the clock signal TX_CK of 5 GHz including jitter, supplied by the clock generator 5, by a factor of 2 to output the clock signal TX_DCK of 2.5 GHZ. Then, the phase shifter 21*b* outputs the clock signals TX DCK_A to D of four types of phases which are each obtained by successively shifting the phase of the frequency-divided clock signal by 90 degrees. In addition, the frequency divider 21*c* further frequency divides the clock signal TX_DCK by a factor of 8 to output the clock signal CLK of 312.5 MHz.

On the other hand, the clock generator 5 is supplied with various types of setting signals for specifying the type and magnitude of jitter to be included in the clock signal TX_CK, and a signal TEST for controlling whether or not a jitter test is to be carried out. More specifically, the clock generator 5 operates so as to carry out the jitter test if the signal TEST is at the H level, thus delivering the clock signal TX_CK including jitter generated in accordance with the various types of setting signals. On the other hand, if the signal TEST is at the L level, the clock generator 5 operates in the normal mode, thus delivering the clock signal TX_CK including no jitter generated.

Now, two exemplary internal configurations of the clock generator 5 shown in FIG. 1 will be described below. First, an exemplary internal configuration 1 of the clock generator 5 shown in FIG. 1 will be described.

Figure 2:
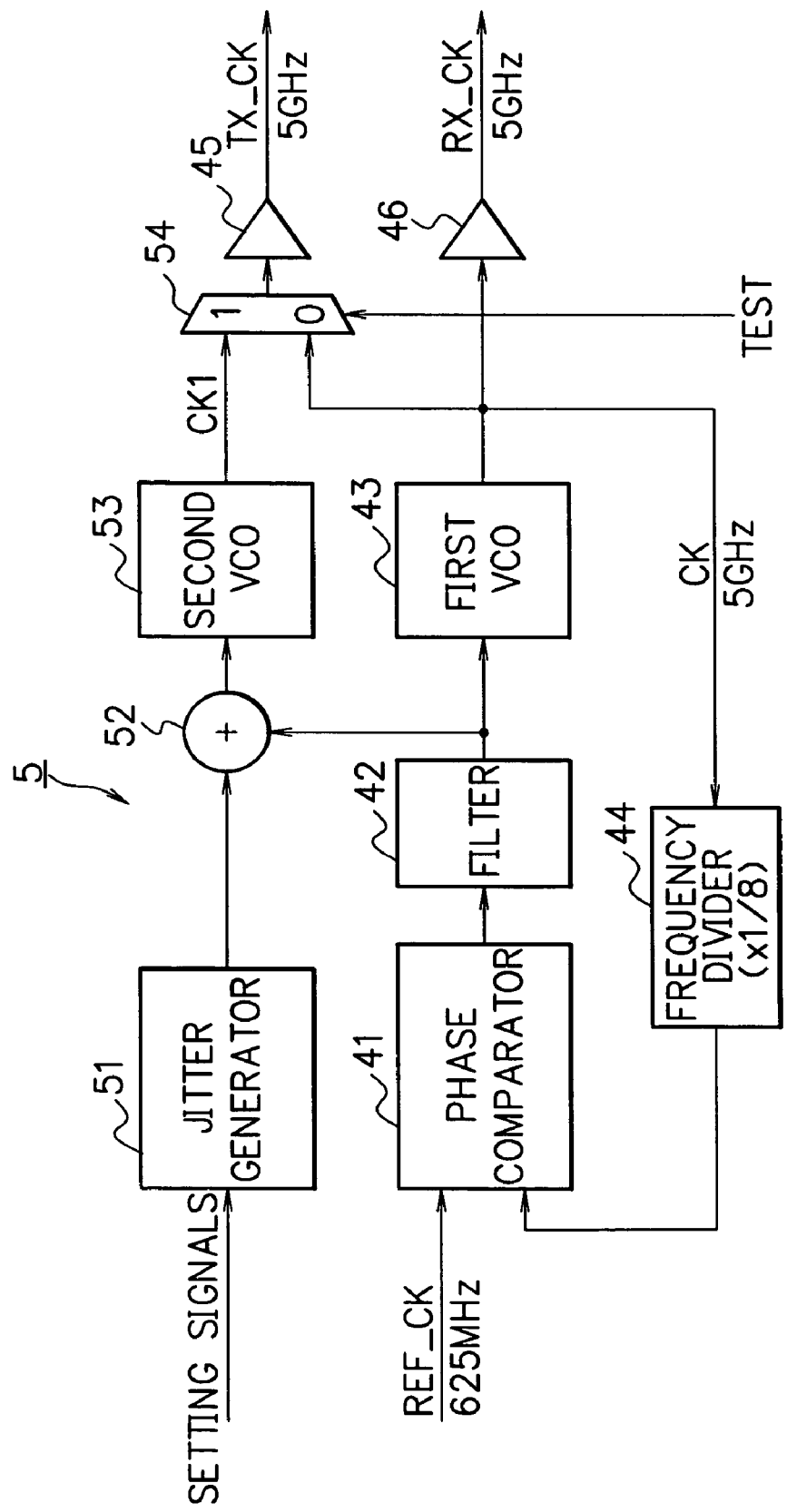
FIG. 2 is a view illustrating an exemplary internal configuration 1 of the clock generator 5 shown in FIG. 1.
Figure 12:
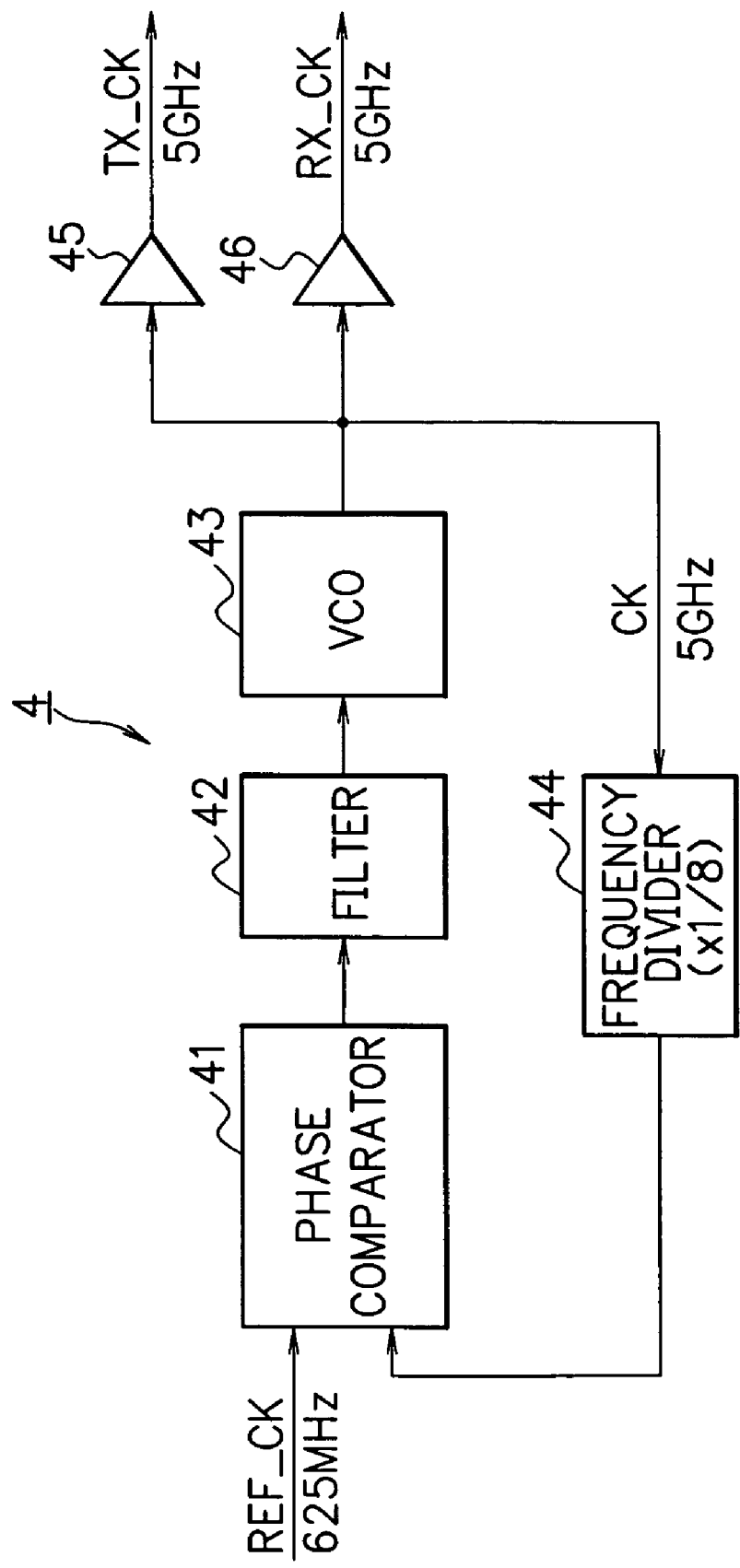
FIG. 12 is a view illustrating an exemplary conventional circuit configuration of the clock generator 4 shown in FIG. 11.

FIG. 2 is a view illustrating the exemplary internal configuration 1 of the clock generator 5 shown in FIG. 1. In the exemplary internal configuration 1 of the clock generator 5 shown in FIG. 2, the components which are indicated by the same reference symbols as those found in the internal configuration of the clock generator 4 shown in FIG. 12 have the like functions, which are not to be explained repeatedly. As shown in FIG. 2, the clock generator 5 includes the phase comparator 41, the filter 42, the first VCO 43, the frequency divider 44, and the buffers 45, 46, which have the same configurations as those of the conventional clock generator 4. In addition to these components, the clock generator 5 further includes a jitter generator 51, a voltage adder 52, a second VCO 53, and a selector 54, for allowing the clock signal TX_CK to include jitter. The first VCO 43 of FIG. 2 is the same as the VCO 43 of FIG. 12 though it is referred to differently only to be distinguished from the second VCO 53.

The aforementioned jitter generator 51 is supplied at its input terminal with the aforementioned various types of setting signals. The output terminal of the jitter generator 51 is connected to the first input terminal of the voltage adder 52. The second input terminal of the voltage adder 52 is coupled to an interconnection between the output terminal of the filter 42 and the input terminal of the first VCO 43. The output terminal of the voltage adder 52 is connected to the input terminal of the second VCO 53. The first input terminal of the selector 54 is connected to the output terminal of the second VCO 53, while the second input terminal of the selector 54 is connected to the output terminal of the first VCO 43. The control terminal of the selector 54 is supplied with the signal TEST. The output terminal of the selector 54 is connected to the input terminal of the buffer 45.

Now, explained below is how the clock generator 5 shown in FIG. 2 generates a clock including jitter.

The jitter generator 51 of FIG. 2 outputs a control voltage having jitter such as of a sinusoidal pattern or a random pattern in accordance with the various types of setting signals. More specifically, the control voltage varies depending on the cycle or amplitude of a sinusoidal pattern or the maximum amplitude of a random pattern which are provided by the various types of setting signals. The voltage adder 52 adds the output voltage from the filter 42 and the control voltage (jitter component) delivered by the jitter generator 51 for output. The second VCO 53 outputs a clock signal CK1 having a frequency (5 GHz+/−jitter) corresponding to the voltage, including the jitter, delivered by the voltage adder 52. That is, the second VCO 53 outputs a clock signal, the frequency of which is varied in accordance with the sum of the control voltage delivered by the jitter generator 51 and the output voltage from the filter 42 in a loop including the first VCO 43.

The selector 54 selectively outputs the clock signal CK1 including jitter when the signal TEST is at the H level, whereas selectively delivering the clock signal CK including no jitter when the signal TEST is at the L level. Thus, when the signal TEST is at the H level, the clock generator 5 outputs the clock signal CK1, including jitter and delivered by the second VCO 53, as the clock signal TX_CK. This allows the clock controller 21 shown in FIG. 1 to output a clock signal obtained by frequency dividing the clock signal TX_CK including jitter. That is, the PRBS pattern generator 22 in the data transmission/reception circuit 1a operates in sync with the clock signal including jitter. The 32:4 converter 25 and the driver circuit 26 convert the parallel data PRBS_DT [31:0] delivered by the PRBS pattern generator 22 into serial data using the clock signal including jitter.

The aforementioned procedure allows the data transmission circuit 2 to output the transmitted data TXRX_DT including jitter. This allows the data reception circuit 3 to receive the transmitted data TXRX_DT including jitter. It is then detected whether the data reception circuit 3 has properly received the transmitted data TXRX_DT including jitter, thereby allowing the test on jitter tolerance to be conducted.

Now, the exemplary internal configuration 2 of the clock generator 5 shown in FIG. 1 will be described.

Figure 3:
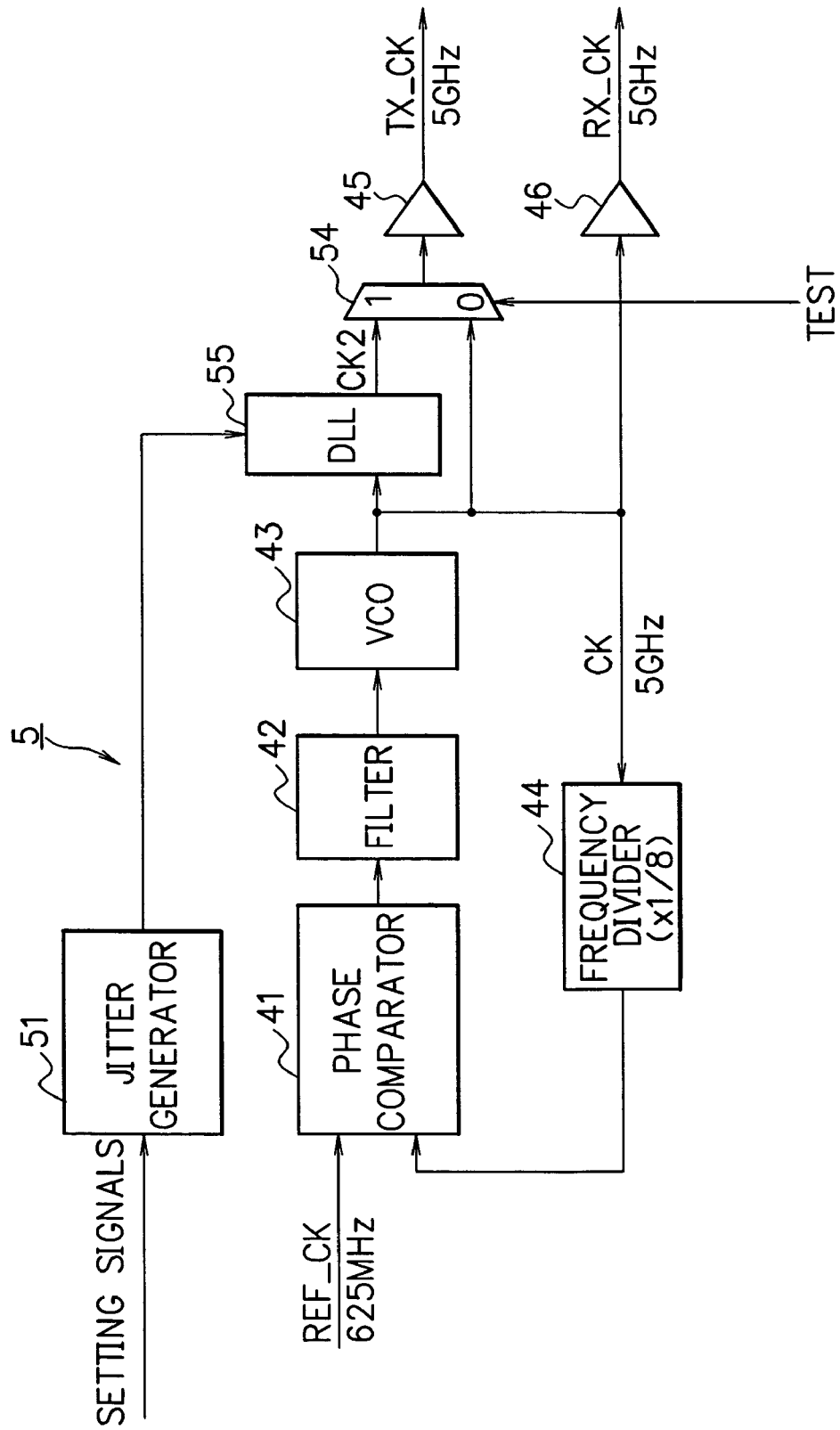
FIG. 3 is a view illustrating an exemplary internal configuration 2 of the clock generator 5 shown in FIG. 1.

FIG. 3 is a view illustrating the exemplary internal configuration 2 of the clock generator 5 shown in FIG. 1. In the exemplary internal configuration 2 of the clock generator 5 shown in FIG. 3, the components which are indicated by the same reference symbols as those found in the internal configuration of the clock generator 4 shown in FIG. 12 have the like functions, which are not to be explained repeatedly. As shown in FIG. 3, the clock generator 5 includes the phase comparator 41, the filter 42, the VCO 43, the frequency divider 44, and the buffers 45, 46, which have the same configurations as those of the conventional clock generator 4. In addition to these components, the clock generator 5 further includes the jitter generator 51, the selector 54, and a DLL (Delay Locked Loop) 55, for allowing the clock signal TX_CK to include jitter. The jitter generator 51 and the selector 54 have the same functions as those shown in FIG. 2.

The aforementioned jitter generator 51 is supplied at its input terminal with the aforementioned various types of setting signals. The output terminal of the jitter generator 51 is connected to the control voltage input terminal of the DLL 55. The clock signal input terminal of the DLL 55 is coupled to the output terminal of the VCO 43. The first input terminal of the selector 54 is connected to the output terminal of the DLL 55, while the second input terminal of the selector 54 is connected to the output terminal of the VCO 43. The control terminal of the selector 54 is supplied with the signal TEST. The output terminal of the selector 54 is connected to the input terminal of the buffer 45.

Now, explained below is how the clock generator 5 shown in FIG. 3 generates a clock including jitter.

The jitter generator 51 of FIG. 3 outputs a control voltage having jitter such as of a sinusoidal pattern or a random pattern in accordance with the various types of setting signals. The DLL 55 varies the amount of its internal delay in accordance with the control voltage provided by the jitter generator 51, thereby varying the frequency of the clock signal supplied by the VCO 43 to output a clock signal CK2. That is, the DLL 55 outputs the clock signal CK2 of a frequency including a jitter component (5 GHz+/−jitter) corresponding to the control voltage provided by the jitter generator 51.

The selector 54 selectively outputs the clock signal CK2 including jitter when the signal TEST is at the H level, whereas selectively delivering the clock signal CK including no jitter when the signal TEST is at the L level. As described above, when the signal TEST is at the H level, the clock generator 5 outputs the clock signal CK2, including jitter and delivered by the DLL 55, as the clock signal TX_CK. As described in the case of FIG. 2, the aforementioned procedure allows the data transmission circuit 2 in the data transmission/reception circuit 1a shown in FIG. 1 to output the transmitted data TXRX_DT including jitter. This also makes it possible to detect whether the data reception circuit 3 has properly received the transmitted data TXRX_DT including jitter, thereby conducting the test on jitter tolerance in the data transmission/reception circuit 1a.

Now, a second embodiment according to the present invention will be explained with reference to a data transmission/reception circuit which includes the aforementioned clock generator 5 and which enables the measurement time of a transmission/reception test including jitter, and the modulation depth (the amount of modulation) and frequency of jitter to be automatically varied to perform multiple measurements. The measurement data obtained through the multiple measurements can be used to plot a graph indicative of the characteristics of jitter tolerance. However, the measurements enough to plot a graph indicative of the characteristics of jitter tolerance are made not during the mass production test but at the stage of manufacturing a prototype product or evaluating the characteristics of the data transmission/reception circuit. The modulation frequency and depth of jitter to be provided to the clock signal during the mass production test is determined based on the characteristics of jitter tolerance. For lack of time during the mass production test, the test is hardly carried out varying the modulation frequency and depth of jitter but typically performed only once on the least allowable jitter tolerance characteristic with respect to the jitter tolerance specification.

Now, a more detailed explanation will be given to the modulation frequency and depth of jitter.

Assuming that the clock signal TX_CK including no jitter has a frequency of fc, the frequency fc' of the clock signal TX_CK including jitter is expressed by the following equation.

$$fc'=fc\{1+d\times\cos(2\pi\times fm\times t)\}$$

where d is the depth of modulation, fm is the modulation frequency, and t is the time variable.

Figure 4:
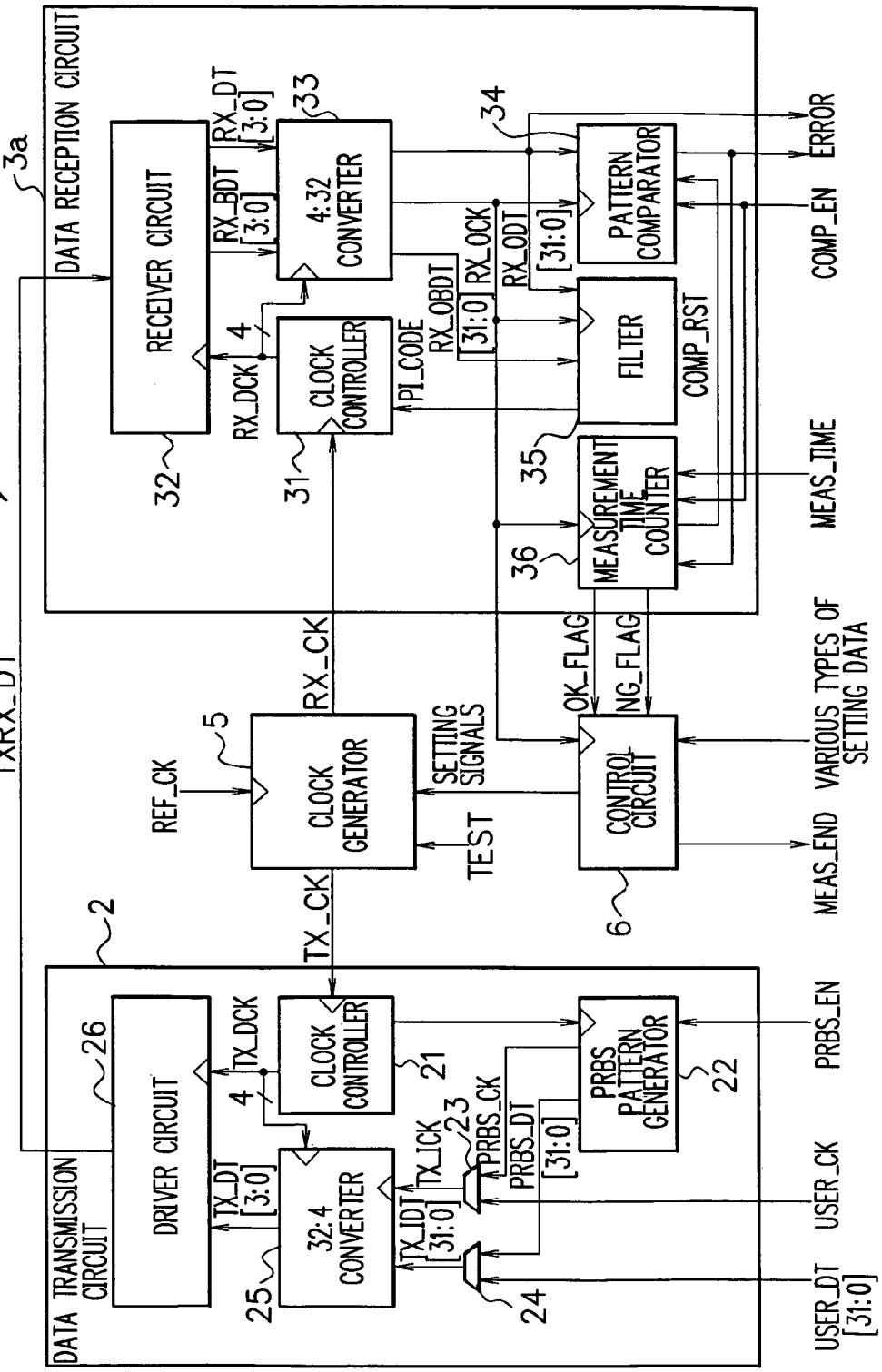
FIG. 4 is a view illustrating the overall configuration of a data transmission/reception circuit including a jitter test circuit according to a second embodiment of the present invention.

FIG. 4 is a view illustrating the overall configuration of a data transmission/reception circuit including a jitter test circuit according to the second embodiment of the present invention. In FIG. 4, the circuits indicated with the same reference symbols as those of FIG. 11 have the like functions or configurations, which are not to be explained repeatedly. A data transmission/reception circuit 1b shown in FIG. 4 is different from the data transmission/reception circuit 1 shown in FIG. 11 in having a data reception circuit 3a, a clock generator 5, and a clock generator control circuit 6.

In this configuration, the data reception circuit 3a is different from the data reception circuit 3 shown in FIG. 11 in having a measurement time counter 36, with the other configuration remaining unchanged. The clock generator 5 of FIG. 4 is the same in configuration as the clock generator 5 shown in FIG. 1. In other words, the internal configuration of the clock generator 5 of FIG. 4 may be either of the one shown in FIG. 2 or of the one shown in FIG. 3. The clock generator control circuit 6 receives the clock signal RX_OCK, and a signal OK_FLAG and a signal NG_FLAG, indicative of test results, from the data reception circuit 3a. The clock generator control circuit 6 also receives various types of setting data from external circuits. In addition, the clock generator control circuit 6 delivers various types of setting signals, which are controlled in accordance with the plurality of signals or data received as mentioned above, to the clock generator 5.

Now, the measurement time counter 36 in the data reception circuit 3a will be described below. The measurement time counter 36 has an input terminal for receiving the clock signal RX_OCK delivered by the 4:32 converter 33. The measurement time counter 36 has also an input terminal for receiving the error flag ERROR delivered by the pattern comparator 34. The measurement time counter 36 has further an input terminal for receiving an enable signal COMP_EN and a measurement time setting signal MEAS_TIME, which are supplied by external circuits. Furthermore, the measurement time counter 36 delivers a reset signal COMP_RST to the pattern comparator 34, while delivering the signal OK_FLAG and the signal NG_FLAG to the clock generator control circuit 6.

The aforementioned measurement time counter 36 is designed to specify the time for evaluating jitter tolerance, the time being made changeable externally by the measurement time setting signal MEAS_TIME. The measurement time counter 36 is made available because the evaluation of jitter tolerance requires a mechanism for receiving, for a period of time corresponding to the specified time, the transmitted/received data TXRX_DT including a sinusoidal jitter of a certain modulation frequency and modulation depth. Furthermore, although not illustrated in FIG. 16, the reset signal COMP_RST delivered by the measurement time counter 36 is supplied, for example, to the sequencer 351 of FIG. 16 to reset the sequencer 351 to the initial state (at the state of the STATE_SEL being at the H level).

The measurement time counter 36 also detects whether the error flag ERROR delivered by the pattern comparator 34 is at the H level for the period of time set by the measurement time setting signal MEAS_TIME (hereinafter referred to as the time setting). More specifically, when having not detected the error flag ERROR being at the H level within the time setting, the measurement time counter 36 determines that the data reception circuit 3a has properly received the data TXRX_DT including the sinusoidal jitter, and then outputs the signal OK_FLAG being at the H level. On the other hand, when having detected the error flag ERROR being at the H level within the time setting, the measurement time counter 36 outputs the signal NG_FLAG being at the H level.

With the signal OK_FLAG being at the H level, this allows the clock generator control circuit 6 to deliver various types of setting signals for instructing the clock generator 5 to change the modulation depth of the jitter. On the other hand, with the signal NG_FLAG being at the H level, the clock generator control circuit 6 delivers various types of setting signals for instructing the clock generator 5 to change the modulation frequency of the jitter. That is, the clock generator control circuit 6 outputs the various types of setting signals in accordance with externally applied various types of setting data and the signals OK_FLAG and NG_FLAG.

More specifically, the various types of setting data received by the clock generator control circuit 6 include data MF_INIT, data MF_STEP, data MD_INIT, data MD_STEP, data MEAS_STOP_MF, and data JT_START. The data MF_INIT is an initial value of the modulation frequency of jitter for a measurement of jitter tolerance. The data MF_STEP is a value indicating a step of change in modulation frequency to be employed when the signal NG_FLAG is at the H level. The data MD_INIT is an initial value of the modulation depth of jitter. The data MD_STEP is a value indicating a step of change in modulation depth to be employed when the signal OK_FLAG is at the H level. The data MEAS_STOP_MF sets the modulation frequency at which a measurement is ended (the measurement end modulation frequency). The data JT_START indicates the start of measurement. Each of the aforementioned pieces of setting data can be altered.

As described above, the clock generator control circuit 6 outputs each of the various types of setting signals in response to the aforementioned settings, thereby varying the circuit parameters of the jitter generator 51 in the clock generator 5 to vary the amount of jitter included in the transmitted/received data TXRX_DT. Upon completing the measurement, the clock generator control circuit 6 delivers a signal MEAS_END indicative of the end of measurement to a circuit external to the data transmission/reception circuit 1b.

Furthermore, the clock generator control circuit 6 stores an internal code, e.g., indicative of the modulation frequency and depth of jitter upon detecting the signal NG_FLAG being at the H level. This allows the data transmission/reception circuit 1b to automatically plot a graph indicative of the characteristics of jitter tolerance. In other words, it is possible to evaluate the jitter tolerance of the data transmission/reception circuit 1b.

Now, an explanation is given to how the data transmission/reception circuit 1b shown in FIG. 4 operates to measure the characteristics of jitter tolerance.

Figure 5:
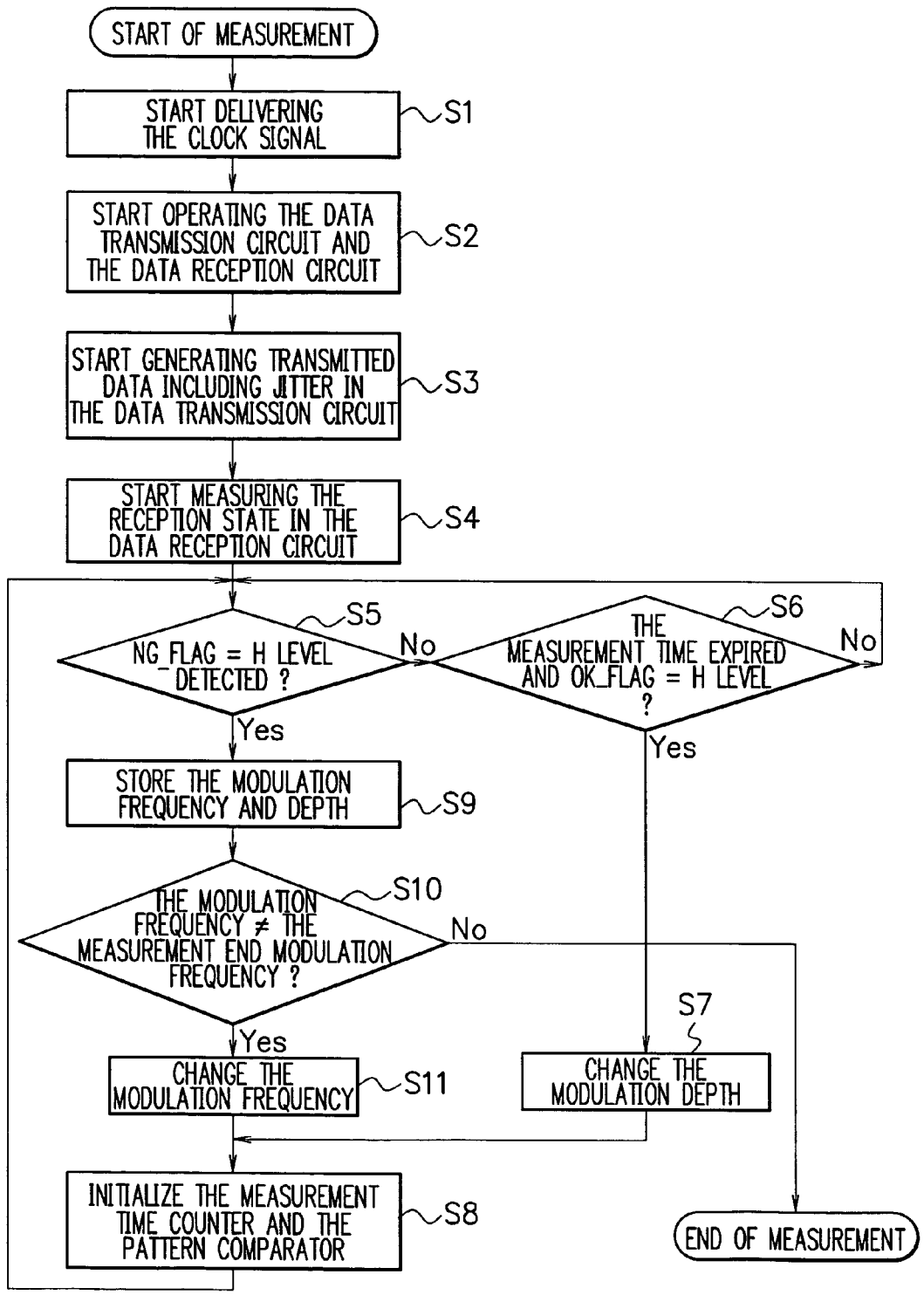
FIG. 5 is a view illustrating how the data transmission/reception circuit 1*b* shown in FIG. 4 operates to measure the characteristics of jitter tolerance.

FIG. 5 is a view illustrating how the data transmission/reception circuit 1b shown in FIG. 4 operates to measure the characteristics of jitter tolerance. As shown in FIG. 5, in step S1, the data JT_START first instructs the clock generator 5 of the data transmission/reception circuit 1b to be activated, thereby providing the signal TEST at the H level. This causes the clock generator 5 to start outputting the clock signal TX_CK including jitter. The process then proceeds to the next step S2 after a sufficient period of time required to stabilize the operation of the PLL in the clock generator 5 has elapsed.

Then, in step S2, the data transmission circuit 2 and the data reception circuit 3a are activated, thereby starting operating in sync with the clock signals TX_CK and RX_CK, respectively. The PRBS_EN is set at the H level. Then, in step S3, the data transmission circuit 2 processes the PRBS pattern data PRBS_DT [31:0] generated at the PRBS pattern generator 22 with a clock signal including jitter, thereby generating the transmitted/received data TXRX_DT including jitter for output. At this time, the clock generator 5, which receives various types of setting signals corresponding to the settings of various types of setting data from the clock generator control circuit 6, allows the clock signal TX_CK to include jitter having the modulation frequency and depth associated with the various types of setting signals received.

Then, in step S4, the data reception circuit 3a receives the transmitted/received data TXRX_DT including jitter to compare it with an expectation value at the pattern comparator 34, thereby starting to measure the reception state. At this time, with the enable signal COMP_EN being at the H level, the measurement time setting signal MEAS_TIME is set to thereby specify measurement time. As explained with reference to FIG. 17, the pattern comparator 34 is driven into the error detection state (i.e., the measurement is started) after the LOCK detection state.

Then, in step S5, the clock generator control circuit 6 detects whether the signal NG_FLAG is at the H level. When the signal NG_FLAG being at the H level has not been detected (in the case of "No" in step S5), the process proceeds to step S6, where the clock generator control circuit 6 detects whether the measurement time has expired and the signal OK_FLAG is at the H level. On the other hand, when the signal NG_FLAG being at the H level has been detected (in the case of "Yes" in step S5), the clock generator control circuit 6 proceeds to step S9. This step S9 will be detailed later.

When it has not been detected in step S6 that the measurement time has expired and the signal OK_FLAG is at the H level (in the case of "No" in step S6), the process returns to step S5, where the data reception circuit 3a continues measuring the reception state, while the clock generator control circuit 6 detects whether the signal NG_FLAG is at the H level. When it has been detected in step S6 that the measurement time has expired and the signal OK_FLAG is at the H level (in the case of "Yes" in step S6), the process proceeds to step S7, where the clock generator control circuit 6 changes the depth of modulation to be provided as jitter. Then, the process proceeds to step S8, where the data reception circuit 3a initializes the measurement time counter 36 and the pattern comparator 34, and then returns to step S5.

The aforementioned changes are made in step S7 to the depth of modulation (so as to increase the depth of modulation in this embodiment) until the signal NG_FLAG being at the H level is detected in step S5. This makes it possible to find the maximum modulation depth at a certain modulation frequency.

Then, when the signal NG_FLAG being at the H level has been detected in step S5 (in the case of "Yes" in step S5), the clock generator control circuit 6 proceeds to step S9 to change the values of the modulation frequency and depth provided as jitter at that time into internal codes for storage. Then, the process proceeds to step S10, where the clock generator control circuit 6 detects whether the modulation frequency stored in step S9 is the same as the measurement end modulation frequency set by the data MEAS_STOP_MF.

When the modulation frequency stored in step S9 is the same as the measurement end modulation frequency (in the case of "No" in step S10), the data transmission/reception circuit 1b ends the measurement on the characteristics of jitter tolerance. On the other hand, when the modulation frequency stored in step S9 is different from the measurement end modulation frequency (in the case of "Yes" in step S10), the clock generator control circuit 6 proceeds to step S11 to change the modulation frequency, and then to step S8. The changes to the modulation frequency in step S11 start at the initial value specified by the data MF_INIT and are made in the steps corresponding to the data MF_STEP. The changes made to the modulation frequency in step S11 allow the jitter tolerance to be measured at each modulation frequency.

The aforementioned processing allows the data transmission/reception circuit 1b to output the modulation frequency and depth stored. This makes it possible to plot each variation in modulation frequency and depth on a graph, thereby presenting the characteristics of jitter tolerance. The data transmission/reception circuit 1b according to this embodiment can also be used to evaluate the characteristics of jitter tolerance using the conventional mass production test system.

Figure 6:
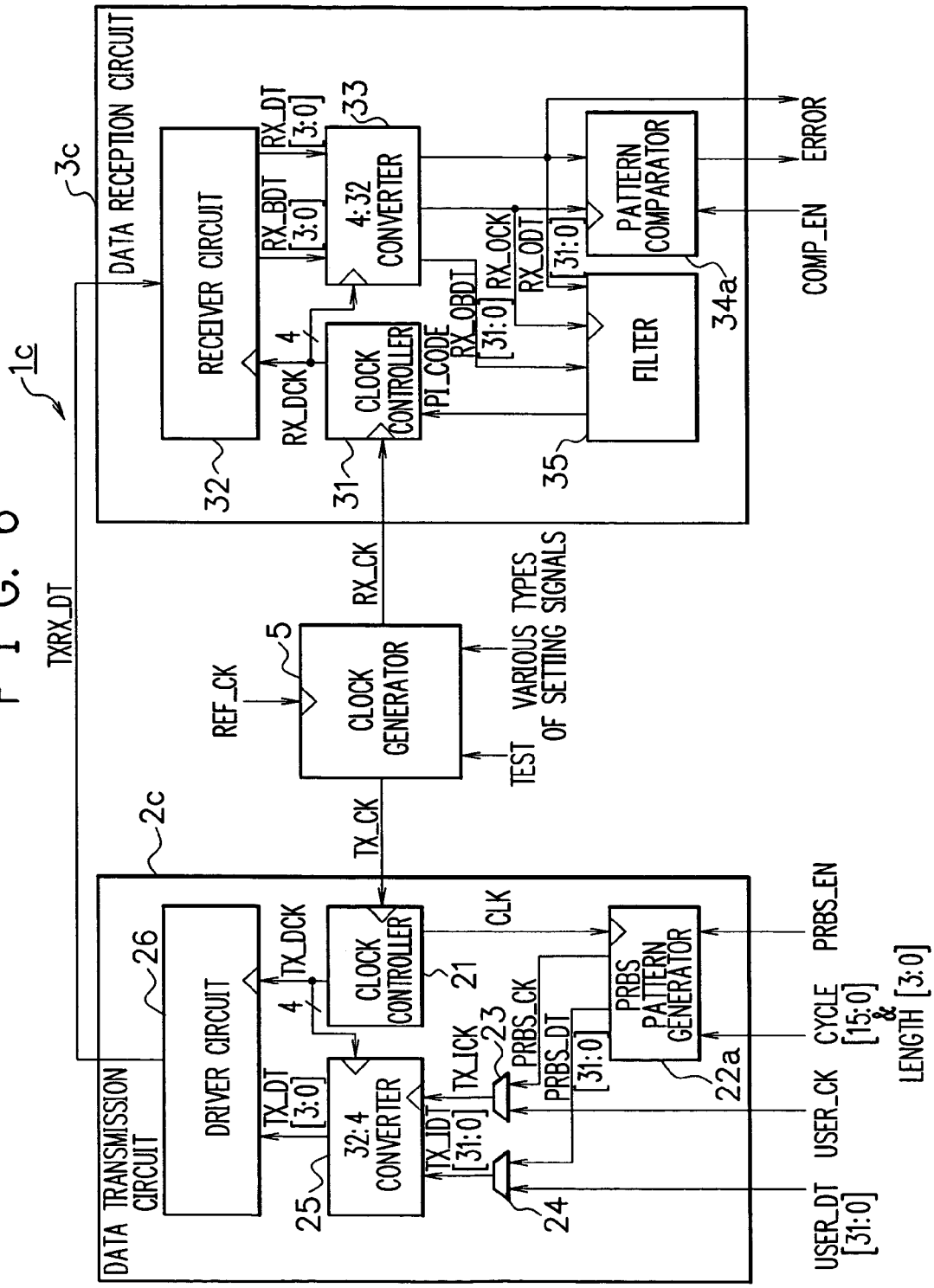
FIG. 6 is a view illustrating the overall configuration of a data transmission/reception circuit including a jitter test circuit according to a third embodiment of the present invention.

Now, a third embodiment according to the present invention will be explained in accordance with a data transmission/reception circuit which enables a transmission/reception test using transmitted/received data including a 0 run length or a 1 run length. FIG. 6 is a view illustrating the overall configuration of a data transmission/reception circuit including a jitter test circuit according to the third embodiment of the present invention. In FIG. 6, the circuits indicated with the same reference symbols as those of FIG. 11 have the like functions or configurations, which are not to be explained repeatedly. A data transmission/reception circuit 1c shown in FIG. 6 is different from the data transmission/reception circuit 1 shown in FIG. 11 in having a data transmission circuit 2c, a data reception circuit 3c, and a clock generator 5.

In this configuration, the data transmission circuit 2c of FIG. 6 is different from the data transmission circuit 2 shown in FIG. 11 in having a PRBS pattern generator 22a, with the other configuration remaining unchanged. The data reception circuit 3c of FIG. 6 is different from the data reception circuit 3 shown in FIG. 11 in having a pattern comparator 34a, with the other configuration remaining unchanged. The clock generator 5 of FIG. 6 is the same in configuration as the clock generator 5 shown in FIG. 1. In other words, the internal configuration of the clock generator 5 of FIG. 6 may be either of the one shown in FIG. 2 or of the one shown in FIG. 3.

The aforementioned PRBS pattern generator 22a generates a PRBS pattern including a 0 run length or a 1 run length. This allows the data transmission circuit 2c to output the transmitted/received data TXRX_DT including a 0 run length or a 1 run length. Additionally, in accordance with external data CYCLE [15:0], the PRBS pattern generator 22a sets the cycle at which part of transmitted/received data is replaced with a 0 run length or a 1 run length. The PRBS pattern generator 22a also sets the lengths of a 0 run length or a 1 run length in accordance with external data LENGTH [3:0].

In generating a PRBS pattern including a 0 run length or a 1 run length, the PRBS pattern generator 22a may preferably replace part of the PRBS pattern with a 0 run length or a 1 run length, or insert a 0 run length or a 1 run length into the PRBS pattern at its some midpoint.

The aforementioned pattern comparator 34a has a function to detect a 0 run length or a 1 run length included in data received. More specifically, the pattern comparator 34a detects that all pieces of the received data (RX_ODT [31:0]) are at the L level or the H level. The pattern comparator 34a has also a function for forcing the error flag ERROR to fall to the L level when having detected a 0 run length or a 1 run length. This allows the data reception circuit 3c to output a proper error flag ERROR even when the transmitted/received data TXRX_DT including a 0 run length or a 1 run length is received.

The aforementioned arrangement allows the data transmission/reception circuit 1c to perform a transmission/reception test on the transmitted/received data TXRX_DT including a 0 run length or a 1 run length and jitter.

Now, an exemplary internal configuration of the PRBS pattern generator 22a shown in FIG. 6 will be described.

FIG. 7 is a view illustrating the exemplary internal configuration of the PRBS pattern generator 22a shown in FIG. 6. In the PRBS pattern generator 22a of FIG. 7, the components which are indicated by the same reference symbols as those found in the exemplary internal configuration of the conventional PRBS pattern generator 22 shown in FIG. 13 have the like functions, which are not to be explained repeatedly. Although a clock signal line for conveying the clock signal CLK is not shown in the PRBS pattern generator 22a of FIG. 7, the clock signal CLK is also supplied to each circuit element having a clock terminal in the circuit of FIG. 7, as with the case of FIG. 13.

Figure 13:
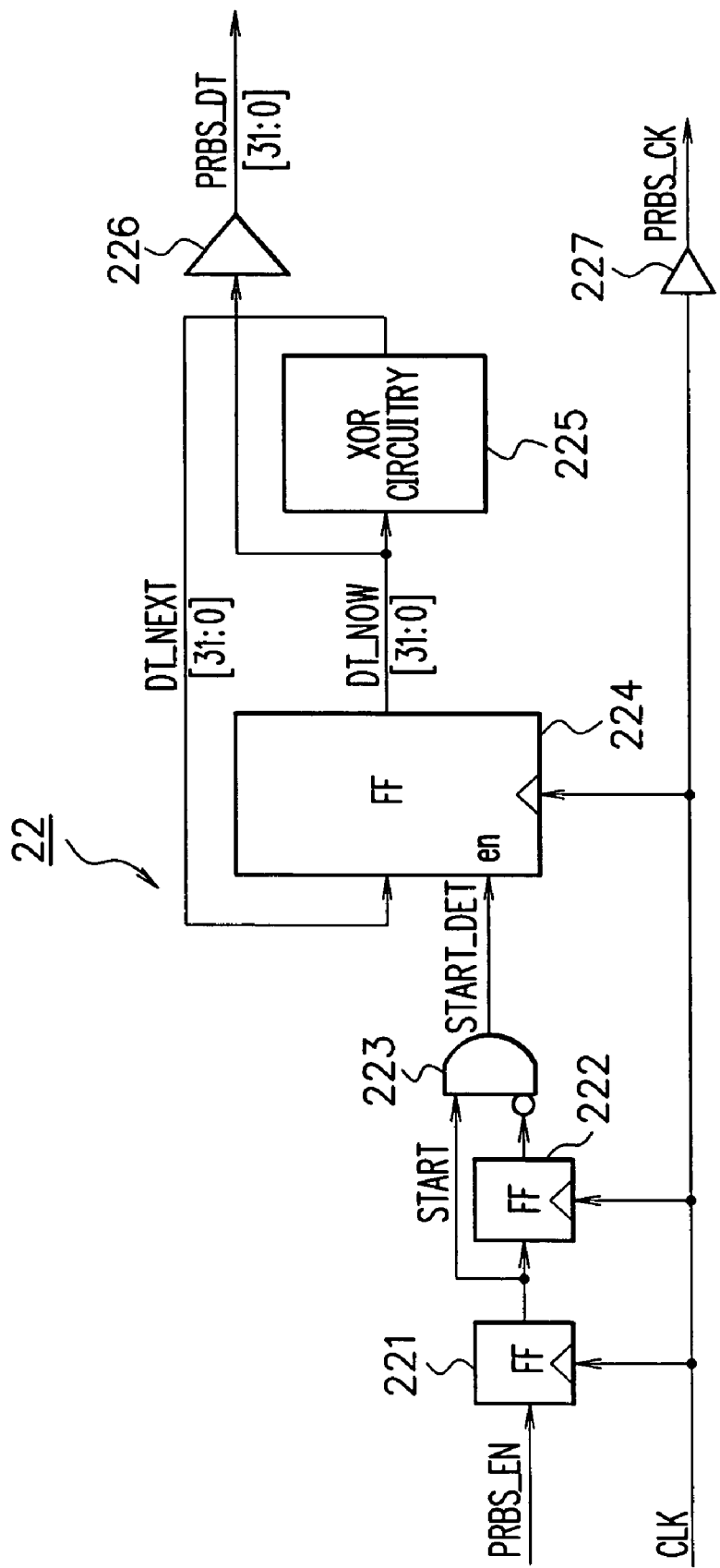
FIG. 13 is a view illustrating an exemplary conventional circuit configuration of the PRBS pattern generator 22 shown in FIG. 11.
Figure 14:
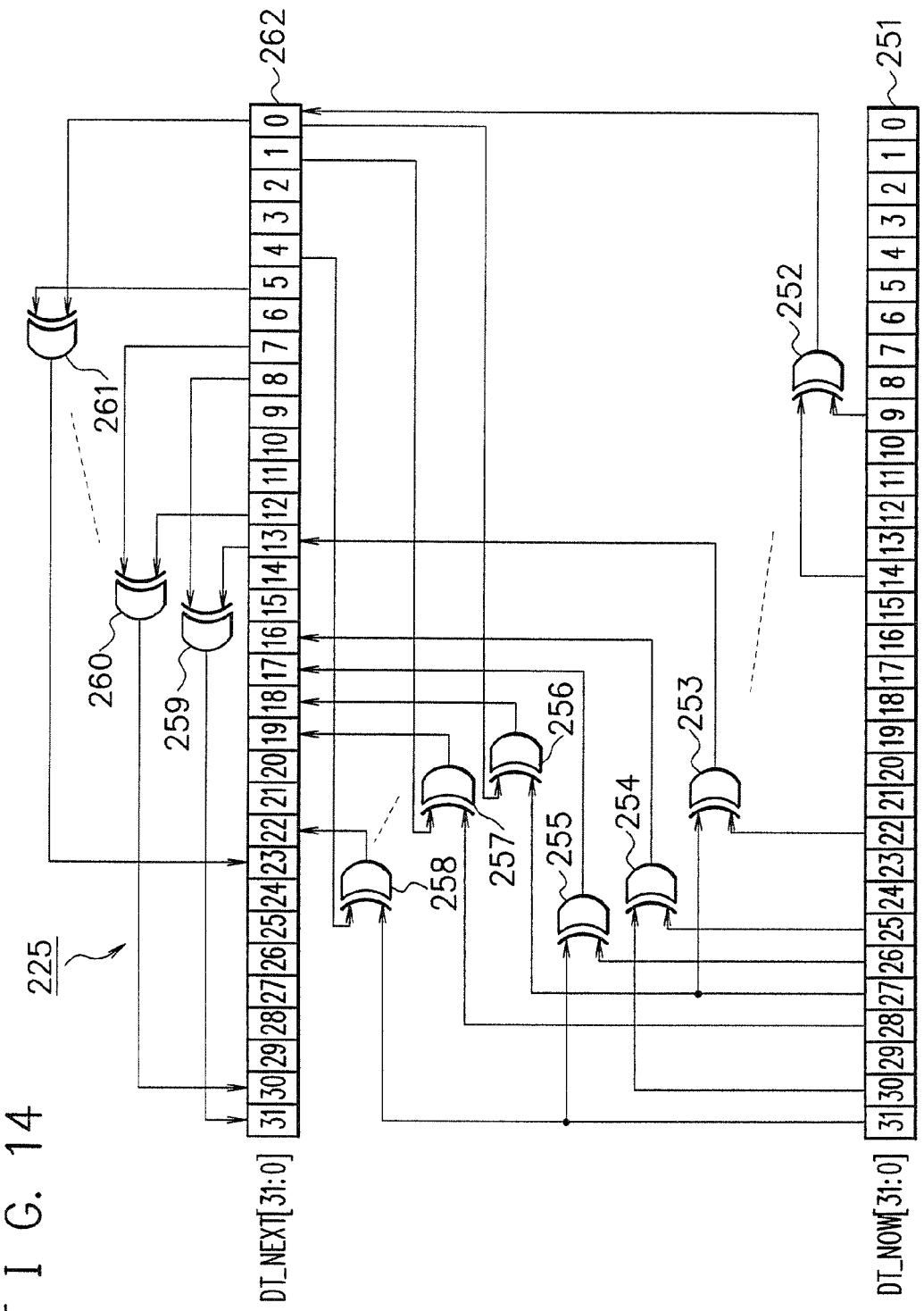
FIG. 14 is a view illustrating a detailed exemplary circuit configuration of the XOR circuitry 225 shown in FIG. 13.
Figure 15:
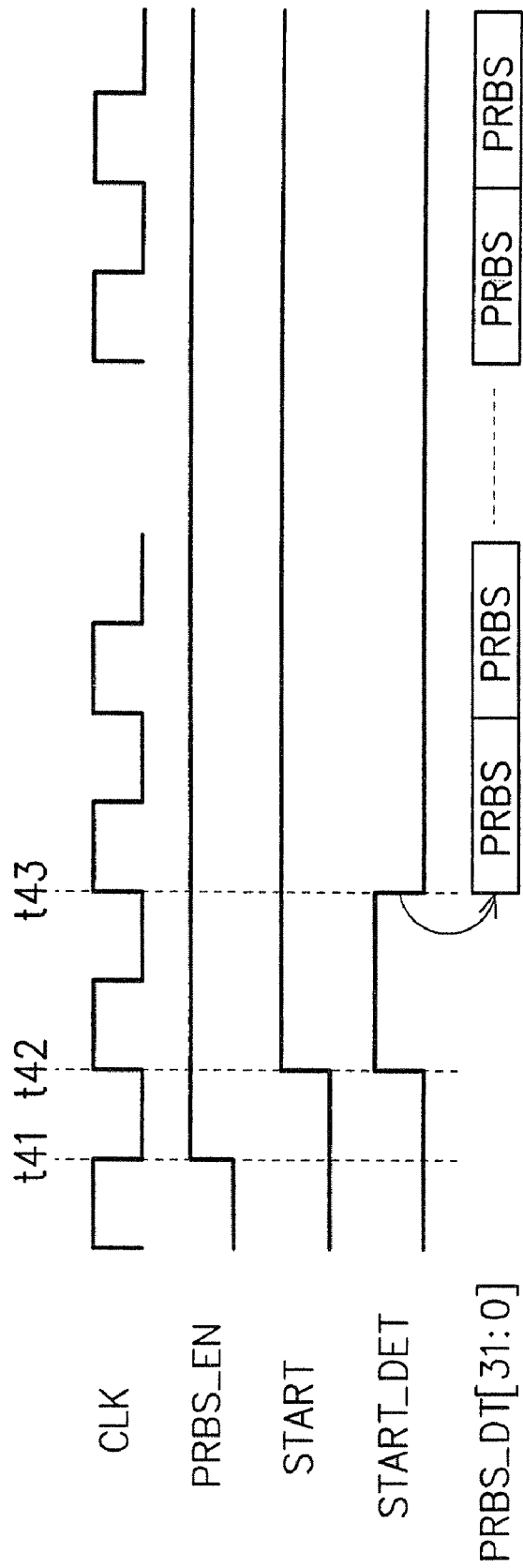
FIG. 15 is an explanatory waveform diagram illustrating the operation of the PRBS pattern generator 22 shown in FIG. 13.

The configuration of FIG. 7 different from the one shown in FIG. 13 is designed to set a cycle in accordance with the external data CYCLE [15:0] to replace part of the transmitted/ received data with a 0 run length or a 1 run length at that cycle. To this end, the PRBS pattern generator 22a includes logic elements 61, 62, 66, 67, a counter A 63, a comparator 64, a flip-flop 65, an input-inverting flip-flop 73 with an enable function (hereinafter simply referred to as the enable inverting FF), and a selector 74. Additionally, to set the length of a 0 run length or a 1 run length in accordance with the external data LENGTH [3:0], the PRBS pattern generator 22a includes a counter B 68, a comparator 69, a flip-flop 70, and logic elements 71, 72.

As shown in FIG. 7, the logic element 61 outputs the signal START_DET, delivered by the logic element 223, ORed with a signal LENGTH_CNT_LOAD delivered by the logic element 66, to the load terminal load of the counter A 63. The logic element 62 delivers the output signal from the comparator 64, ANDed with the complement of the output signal from the logic element 72, as a signal CYCLE_CNT_EN.

The counter A 63 includes an input terminal for loading (capturing the value of) the external data CYCLE [15:0], the load terminal load for receiving from the logic element 61 a signal for instructing the timing at which data is loaded, an enable terminal en, and a clock terminal for receiving the clock signal. The enable terminal en is activated by the signal CYCLE_CNT_EN being at the H level, supplied by the logic element 62, whereas inactivated by the signal CYCLE_CNT_EN being at the L level. The counter A 63 also employs the loaded data CYCLE [15:0] as an initial value to output the data CYCLE_CNT [15:0] which is counted down in sync with the rising edge of the clock signal CLK.

The comparator 64 compares the data CYCLE_CNT [15:0] delivered by the counter A 63 with all L data [15:0] of all 16 bits being at the L level. The comparator 64 then outputs the H level if there is no match, whereas delivering the L level if there is a match. Additionally, the comparator 64 supplies its output signal to the input terminals of the logic element 62 and the flip-flop 65 and to the inverting input terminal of the logic element 66. The flip-flop 65 delivers the output signal from the comparator 64 to the input terminal of the logic element 66 in sync with the rising edge of the clock signal CLK.

The logic element 66 outputs the complement of the signal, supplied by the comparator 64 to the inverting input terminal, ANDed with the signal supplied by the flip-flop 65 to the input terminal, as the signal LENGTH_CNT_LOAD. The signal LENGTH_CNT_LOAD delivered by the logic element 66 is supplied to the input terminals of the logic elements 61, 67 and the load terminal load of the counter B 68. The flip-flop 65 and the logic element 66 constitute a falling-edge detector circuit.

The logic element 67 outputs the signal LENGTH_CNT_LOAD, delivered by the logic element 66, ORed with the signal CYCLE_CNT_EN delivered by the logic element 62, as a signal DT_SEL. The signal DT_SEL delivered by the logic element 67 is supplied to the control terminal of the selector 74 to control the selector 74.

On the other hand, the counter B 68 includes an input terminal for loading (capturing the value of) the external data LENGTH [3:0], the load terminal load for receiving from the logic element 66 the signal LENGTH_CNT_LOAD for instructing the timing at which data is loaded, an enable terminal en, and a clock terminal for receiving the clock signal. The enable terminal en is activated by a signal, being at the H level, supplied by the comparator 69, whereas inactivated by the signal being at the L level. The counter B 68 also employs the loaded data LENGTH [3:0] as an initial value to output the data LENGTH_CNT [3:0] which is counted down in sync with the rising edge of the clock signal CLK.

The comparator 69 compares the data LENGTH_CNT [3:0] delivered by the counter B 68 with all L data [3:0] of all 4 bits being at the L level. The comparator 69 then outputs a signal LENGTH_CNT_EN being at the H level if there is no match, whereas delivering the signal LENGTH_CNT_EN being at the L level if there is a match. Additionally, the comparator 69 supplies its output signal LENGTH_CNT_EN to the input terminals of the logic element 72 and flip-flop 70, to the inverting input terminal of the logic element 71, and to the enable terminal en of the counter B 68. The flip-flop 70 delivers the signal LENGTH_CNT_EN, supplied by the comparator 69, to the input terminal of the logic element 71 in sync with the rising edge of the clock signal CLK.

As a signal LENGTH_CNT_END supplied to the input terminal of the logic element 72, the logic element 71 outputs the complement of a signal LENGTH_CNT_EN, supplied by the comparator 69 to the inverting input terminal, ANDed with the signal supplied by the flip-flop 70 to the input terminal. The logic element 72 delivers the signal LENGTH_CNT_END ORed with the signal LENGTH_CNT_EN to the inverting input terminal of the logic element 62 and the enable terminal en of the enable inverting FF 73. The flip-flop 70 and the logic element 71 constitute a falling-edge detector circuit.

The enable inverting FF 73 has the inverting input terminal for receiving the signal delivered from its own output terminal, the enable terminal en for receiving the signal delivered by the logic element 72, and the clock terminal for receiving the clock signal CLK. The enable inverting FF 73 inverts the signal supplied to the inverting input terminal in sync with the rising edge of the clock signal CLK for output to the second input terminal of the selector 74. The input and output signals to and from the enable inverting FF 73 have a bit width of 32 bits. That is, in the form of serial data, the enable inverting FF 73 would be able to alternately output a 32-bit contiguous sequence of 0 run or 1 run.

The selector 74 has a first input terminal for receiving the data DT_NOW [31:0] delivered by the flip-flop 224 with an enable function, a second input terminal for receiving the output from the enable inverting FF 73, and a control terminal for receiving the signal DT_SEL delivered by the logic element 67. The selector 74 delivers a signal, selected in accordance with the signal DT_SEL, from its output terminal to the input terminal of a flip-flop 75. This allows the flip-flop 75 to output the signal, supplied by the selector 74, as the data PRBS_DT [31:0] in sync with the rising edge of the clock signal CLK. With the signal DT_SEL being at the H level, the selector 74 selectively outputs the data DT_NOW [31:0] delivered by the flip-flop 224 with an enable function, whereas with the signal DT_SEL being at the L level, selectively delivering the output from the enable inverting FF 73.

Figure 8:
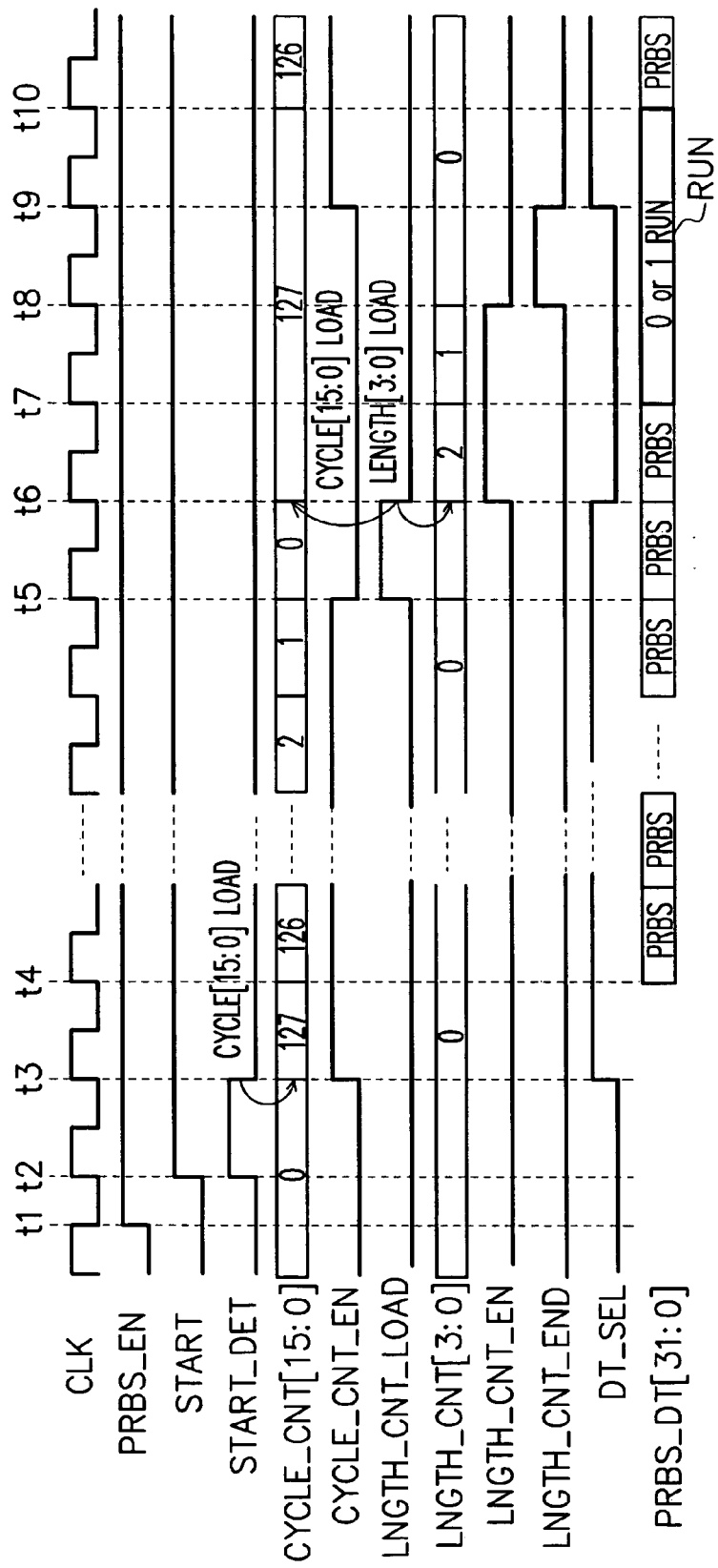
FIG. 8 is a waveform diagram illustrating the operation of the PRBS pattern generator 22*a* shown in FIG. 7.

Now, described below is how the PRBS pattern generator 22a shown in FIG. 7 operates. FIG. 8 is a waveform diagram illustrating the operation of the PRBS pattern generator 22a shown in FIG. 7. As shown in FIG. 8, at time t1, an external enable signal PRBS_EN rises. Then, at time t2, on the rising edge of the clock signal CLK, the flip-flop 221 latches the enable signal PRBS_EN in response to the rising edge of the clock signal CLK, thereby causing the signal START to rise to the H level. This allows the signal START_DET delivered by the logic element 223 to rise to the H level, while the output signal from the logic element 61 rises to the H level.

Then, at time t3, on the rising edge of the clock signal CLK, the signal START_DET delivered by the logic element 223 falls to the L level, and the output signal from the logic element 61 falls to the L level as well. This causes the data CYCLE [15:0] supplied to the counter A 63 to be captured as an initial value for a countdown, and the value is delivered as the data CYCLE_CNT [15:0]. In this embodiment, the initial value is 127 as shown in FIG. 8.

This also causes the output from the comparator 64 to rise to the H level as well as the signal CYCLE_CNT_EN delivered by the logic element 62 to rise to the H level. This further causes the signal DT_SEL delivered by the logic element 67 to rise to the H level. The aforementioned procedure allows the selector 74 to selectively output the PRBS pattern data DT_NOW [31:0] that is generated through the configuration of the flip-flop 224 with an enable function and the XOR circuitry 225. That is, at time t4, the PRBS pattern generator 22a outputs the data DT_NOW [31:0] generated, as the data PRBS_DT [31:0]. Thereafter, the PRBS pattern generator 22a outputs the data DT_NOW [31:0] generated, as the data PRBS_DT [31:0], for the period of time in which the counter A 63 counts down until the data CYCLE_CNT [15:0] becomes equal to zero.

Then, at time t5, when the data CYCLE_CNT [15:0] delivered by the counter A 63 has reached zero, the signal delivered by the comparator 64 falls to the L level, and the signal CYCLE_CNT_EN delivered by the logic element 62 also falls to the L level. This also causes the signal LENGTH_CNT_LOAD delivered by the logic element 66 to rise to the H level.

Then, at time t6, on the rising edge of the clock signal CLK, the signal LENGTH_CNT_LOAD delivered by the logic element 66 falls to the L level. This causes the signal DT_SEL from the logic element 67 to fall to the L level and the selector 74 to selectively output the output data [31:0] delivered by the enable inverting FF 73. In addition, the output signal from the logic element 62 also falls to the L level, causing the data CYCLE [15:0] supplied to the counter A 63 to be captured as an initial value for a countdown, the value being delivered as the data CYCLE_CNT [15:0].

Furthermore, the data LENGTH [3:0] supplied to the counter B 68 is captured as an initial value for a countdown, the value being delivered as the data LENGTH_CNT [3:0]. This allows the signal LENGTH_CNT_EN delivered by the comparator 69 to rise to the H level as well as the output signal from the logic element 72 to rise to the H level. This also causes the enable inverting FF 73 to be activated and the output data [31:0] of a 0 run length or a 1 run length to be delivered. In this embodiment, the data LENGTH [3:0] specifies an initial value of data LENGTH [3:0]=2, as shown in FIG. 8.

As described above, at time t7, the PRBS pattern generator 22a outputs the output data [31:0] of a 0 run length or a 1 run length generated by the enable inverting FF 73, as the data PRBS_DT [31:0]. Thereafter, the PRBS pattern generator 22a outputs the data [31:0] generated by the enable inverting FF 73, as the data PRBS_DT [31:0], for the period of time in which the counter B 68 counts down until the data LENGTH_CNT [3:0] becomes equal to zero. This makes it possible for part of the PRBS pattern to be replaced with a 0 run length or a 1 run length as shown by symbol RUN in FIG. 8.

Furthermore, at time t8, with the data LENGTH_CNT [3:0] being equal to zero, the signal LENGTH_CNT_EN delivered by the logic element 69 falls to the L level. This causes the signal LENGTH_CNT_END delivered by the logic element 71 to rise to the H level.

Then, at time t9, the signal LENGTH_CNT_END delivered by the logic element 71 falls to the L level, and the output from the logic element 72 also falls to the L level. This causes the signal CYCLE_CNT_EN delivered by the logic element 62 to rise to the H level as well as the signal DT_SEL delivered by the logic element 67 to rise to the H level. The aforementioned procedure allows the selector 74 to selectively output the PRBS pattern data DT_NOW [31:0] again. On the other hand, since the signal CYCLE_CNT_EN supplied to the enable terminal en rises to the H level, the counter A 63 also starts a countdown. Then, at time t10, in response to the rising edge of the clock signal CLK, the flip-flop 75 starts delivering the PRBS pattern data PRBS_DT [31:0]. Meanwhile, the counter A 63 decrements the data CYCLE_CNT [15:0].

As described above, the PRBS pattern generator 22a generates the signal DT_SEL for specifying the timing at which the PRBS pattern is replaced with a 0 run length or a 1 run length, depending on the combination of the output CYCLE_CNT [15:0] from the counter A 63 and the output LENGTH_CNT [3:0] from the counter B 68. Furthermore, when the PRBS pattern of transmitted data is not desired to include a 0 run length or a 1 run length, the PRBS pattern generator 22a can also provide the LENGTH [3:0] equal to zero.

Now, an exemplary internal configuration of the pattern comparator 34a shown in FIG. 6 will be described.

Figure 9:
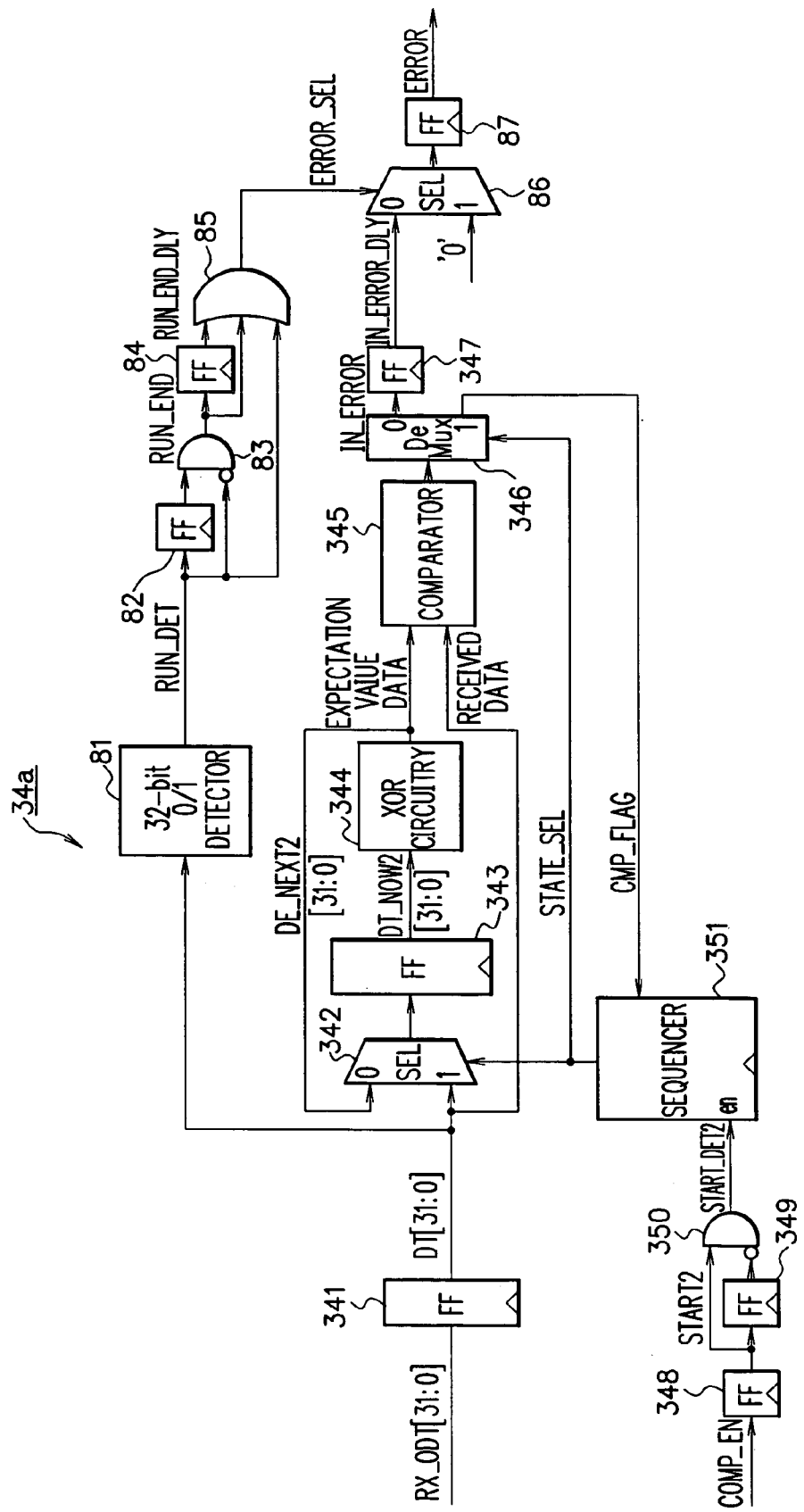
FIG. 9 is a view illustrating an exemplary internal configuration of the pattern comparator 34*a* shown in FIG. 6.

FIG. 9 is a view illustrating the exemplary internal configuration of the pattern comparator 34a shown in FIG. 6. In the pattern comparator 34a of FIG. 9, the components which are indicated by the same reference symbols as those found in the exemplary internal configuration of the conventional pattern comparator 34 shown in FIG. 16 have the like functions, which are not to be explained repeatedly. Although a clock signal line for conveying the clock signal RX_OCK is not shown in the pattern comparator 34a of FIG. 9, the clock signal RX_OCK is also supplied to each circuit element having a clock terminal (indicated by a triangle in FIG. 9) as with the pattern comparator 34 shown in FIG. 16.

Figure 16:
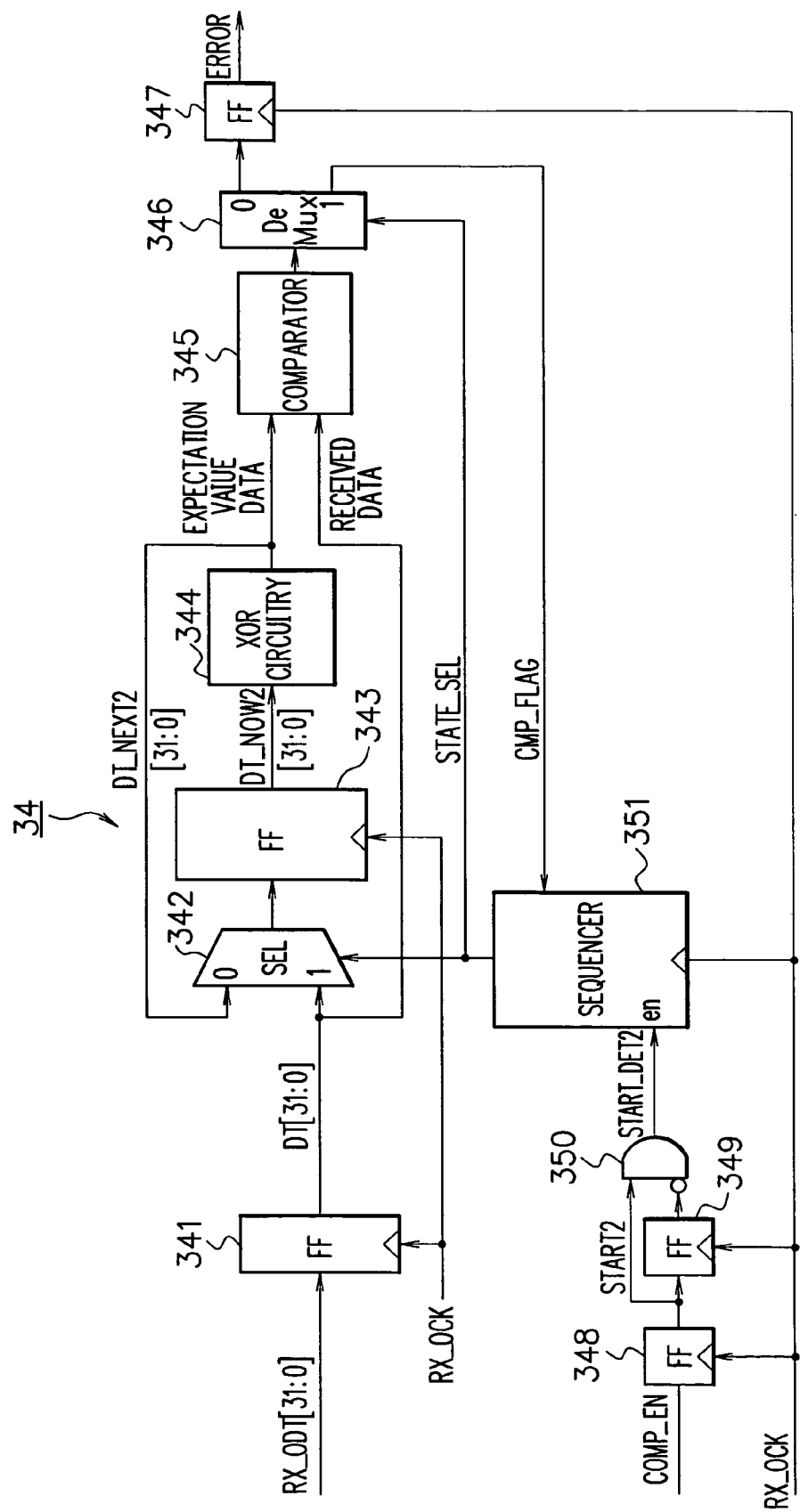
FIG. 16 is a view illustrating an exemplary conventional circuit configuration of the pattern comparator 34 shown in FIG. 11.

The pattern comparator 34a shown in FIG. 9 is different from the pattern comparator 34 shown in FIG. 16 in having a function to detect a 0 run length or a 1 run length in received data and mask (cover) the error flag ERROR corresponding to the received data. That is, the pattern comparator 34a shown in FIG. 9 is configured differently from the pattern comparator 34 shown in FIG. 16 in having a 0/1 detector 81, flip-flops 82, 84, and logic elements 83, 85 to detect that the received data (the data DT [31:0] of FIG. 9) is all 0s or 1s. The pattern comparator 34a further includes a selector 86 and a flip-flop 87 to mask the error flag ERROR (force the error flag to fall to the L level) upon receiving a 0 run length and a 1 run length.

In FIG. 9, the 0/1 detector 81 detects that the received data (the data DT [31:0] of FIG. 9) is of all 0s or 1s, and then outputs a detection signal RUN_DET (at the H level upon detection). In response to the rising edge of the clock signal RX_OCK, the flip-flop 82 outputs the detection signal RUN_DET supplied by the 0/1 detector 81. As an output signal RUN_END, the logic element 83 outputs a signal obtained by ANDing the output signal supplied from the flip-flop 82 to the input terminal and the complement of the detection signal RUN_DET supplied from the 0/1 detector 81 to the inverting input terminal.

In response to the rising edge of the clock signal RX_OCK, the flip-flop 84 delays the signal RUN_END supplied by the logic element 83 by one clock to output the resulting signal RUN_END_DLY. The logic element 85 outputs a signal ERROR_SEL that is obtained by ORing the detection signal RUN_DET supplied by the 0/1 detector 81, the signal RUN_END supplied by the logic element 83, and the signal RUN_END_DLY supplied by the flip-flop 84. The aforementioned arrangement allows the pattern comparator 34a to detect a 0 run length or a 1 run length in the received data to output the signal ERROR_SEL that is extended in width by one clock before and after the duration detected.

Then, the selector 86 selectively outputs a signal IN_ERROR_DLY, delivered by the flip-flop 347, to the flip-flop 87 when the signal ERROR_SEL delivered by the logic element 85 is at the L level (with a 0 run or a 1 run having not been detected). Additionally, the selector 86 selectively outputs a 0-fixed (a L-level-fixed) signal to the flip-flop 87 when the signal ERROR_SEL delivered by the logic element 85 is at the H level (with a 0 run or a 1 run having been detected). The flip-flop 87 outputs the signal supplied by the selector 86 as the error flag ERROR in sync with the clock signal RX_OCK.

In addition to the conventional function to generate the expectation value of a PRBS pattern to compare it with received data, the arrangement shown above allows the pattern comparator 34a to further include a function for detecting a 0 run length and a 1 run length, and a function for forcing the error flag ERROR to be fixed to the L level when a 0 run length and a 1 run length are detected.

Figure 10:
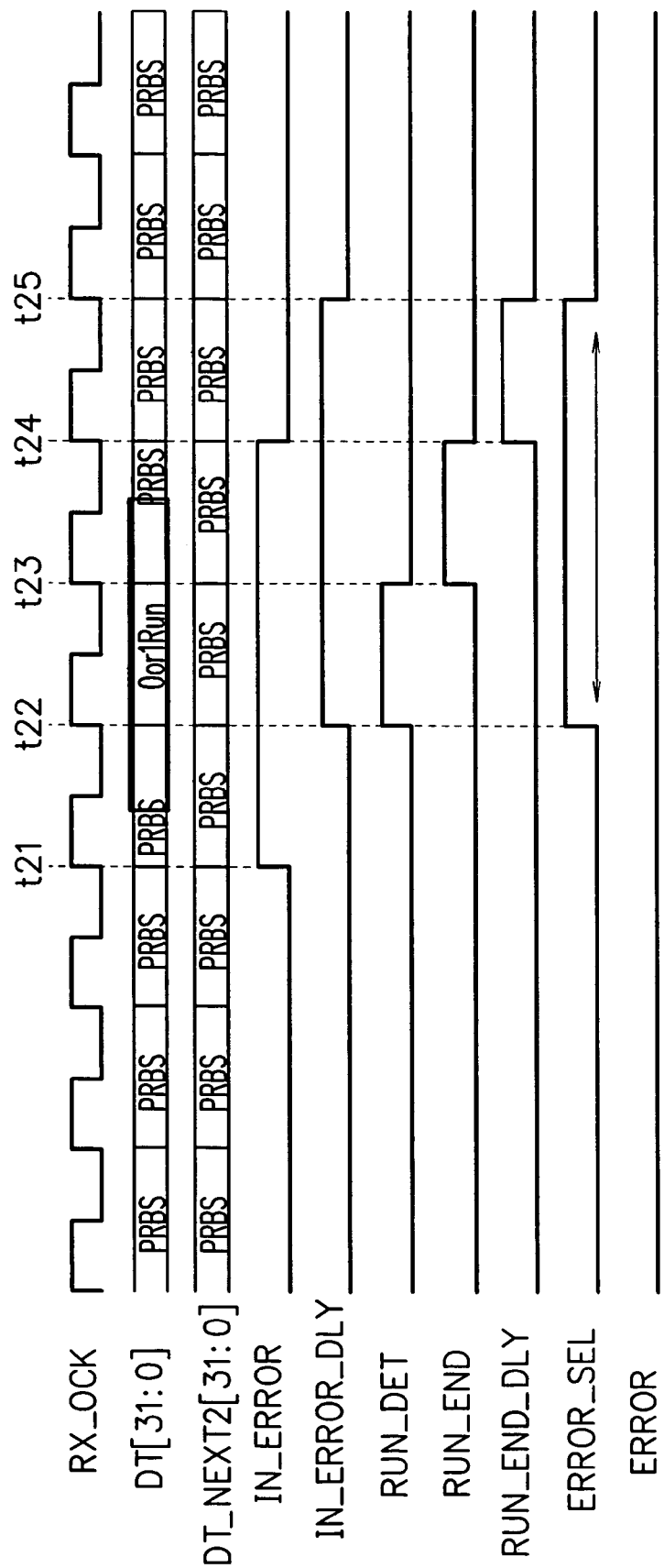
FIG. 10 is a waveform diagram illustrating the operation of the pattern comparator 34*a* shown in FIG. 9.

Now, described below is how the pattern comparator 34a shown in FIG. 9 operates. FIG. 10 is a waveform diagram illustrating the operation of the pattern comparator 34a shown in FIG. 9. As shown in FIG. 10, at time t21, the received data DT [31:0], which includes a 0 run length or a 1 run length and is different from the expectation value data corresponding to the PRBS pattern, causes the output signal from the comparator 345 to rise to the H level. This causes a signal IN_ERROR delivered by the demultiplexer 346 to rise to the H level.

Then, at time t22, the flip-flop 347 captures the signal IN_ERROR delivered by the demultiplexer 346 to raise the signal IN_ERROR_DLY to the H level in sync with the rising edge of the clock signal RX_OCK. The 0/1 detector 81 detects the 0 run length or the 1 run length in the received data DT [31:0] to raise the detection signal RUN_DET to the H level. This allows the signal ERROR_SEL delivered by the logic element 85 to rise to the H level.

Then, at time t23, the 0/1 detector 81 detects the end of the 0 run length or the 1 run length in the received data DT [31:0], thereby allowing the detection signal RUN_DET to fall to the L level. The logic element 83 raises the signal RUN_END to the H level, which has been obtained by delaying the detection signal RUN_DET by one clock at the flip-flop 82. This allows the signal ERROR_SEL delivered by the logic element 85 to be held at the H level. The flip-flop 82 and the logic element 83 detects the falling edge of the detection signal RUN_DET.

Then, at time t24, the logic element 83 allows the signal RUN_END to fall to the L level, which has been obtained by delaying the detection signal RUN_DET by one clock at the flip-flop 82. The flip-flop 84 raises the signal RUN_END_DLY to the H level that has been obtained by delaying the signal RUN_END by one clock. This allows the signal ERROR_SEL delivered by the logic element 85 to be held at the H level. On the other hand, the received data DT [31:0] corresponding to a PRBS pattern not including a 0 run length or a 1 run length is compared with the expectation value data corresponding to the PRBS pattern, thereby allowing the output signal from the comparator 345 to fall to the L level. This causes the signal IN_ERROR delivered by the demultiplexer 346 to fall to the L level.

Then, at time t25, the flip-flop 84 allows the signal RUN_END_DLY to fall to the L level, which has been obtained by delaying the signal RUN_END by one clock. This allows the signal ERROR_SEL delivered by the logic element 85 to fall to the L level. This also causes the signal IN_ERROR_DLY obtained by delaying the signal IN_ERROR delivered by the flip-flop 347 by one clock to fall to the L level.

As described above, for the duration of the signal IN_ERROR_DLY being at the H level in which a 0 run length or a 1 run length is detected as an error (or the duration of ERROR output being masked), the signal ERROR_SEL can be raised to the H level, thereby making it possible to force the error flag ERROR to fall to the L level.

Now, the features of this embodiment will be explained in more detail. In general, as described above, the pattern comparison sequence is divided into the state of detecting the head of data (LOCK detection state) and the error detection state. The control signal STATE_SEL in FIGS. 9 and 16 shows those states. Here, the STATE_SEL being at the H level corresponds to the LOCK detection state, whereas the L level corresponding to the error detection state. The pattern comparator 34a has the same circuit as the pattern generator 22a, for generating a PRBS pattern. In the LOCK detection state, the pattern generator 34a captures the received data at every cycle to generate expectation value data using it as an initial value.

For example, suppose that data of a 0 run length or a 1 run length is received in the LOCK detection state. In this case, the pattern generator 34a cannot detect the LOCK state and thus has to detect the LOCK state again. On the other hand, in the error detection state, expectation value data continues to be generated with the expectation value data captured at the end of the LOCK detection state being employed as an initial value. Even one bit in the received data mismatching the expectation value data would be considered as an error. The conventional pattern comparator 34 outputs this error flag as it is. On the other hand, when having received data of a 0 run length or a 1 run length, the pattern comparator 34a according to this embodiment masks the error flag.

However, in this case, the data of a 0 run length or a 1 run length must include 64 bits or more. For example, as described above, the SONET standard defines the maximum length of 72 bits as the data of a 0 run length or a 1 run length. For this reason, this embodiment sets the data length of a 0 run length or a 1 run length to 96 bits by setting the LENGTH [2:0] to 2 in order to set it in the PRBS pattern generator of the data transmission circuit. This realizes a severer test than one in accordance with the aforementioned SONET standard. As described above, this embodiment employs the signal ERROR_SEL to specify the period of time during which the error flag ERROR is masked. Outside this period of time of masking, like in the prior art, the expectation value data is compared with the received data to detect an error, so that the error flag ERROR is delivered at the H level each time an error is detected.

While using the conventional mass production test system, the aforementioned arrangement allows the data transmission/reception circuit 1c of this embodiment to provide transmitted/received data which includes a PRBS pattern of 0 run length or 1 run length data as well as jitter for transmission or reception. That is, upon evaluating jitter tolerance, a test on a 0 run length or a 1 run length can also be conducted at the same time, thereby making it possible to improve failure detection power.

In the foregoing, the present invention have been described in detail in accordance with the specific embodiments with reference to the drawings; however, the specific configuration of the invention is not limited to these embodiments but may also include the designs which will not depart from the scope and sprit of the invention.

As described above, the data transmission device and the I/O interface circuit with the data transmission circuit according to the present invention allow the clock signal supplied to the data transmission circuit to include jitter, and thus the transmitted data delivered by the data transmission circuit to include jitter as well. This allows for checking whether the data reception circuit properly receives the transmitted data, thereby making it possible to test jitter resistance (jitter tolerance). This makes it also possible to improve the failure detection power in the mass production test.

What is claimed is:

1. An I/O interface circuit comprising:
a clock generation circuit generating a first clock signal;
a jitter generator generating jitter in the first clock signal based on a setting signal, which sets a present condition of the jitter;
a data transmission circuit transmitting data in sync with the first clock signal including the jitter;
a data reception circuit receiving the transmitted data, wherein the clock generation circuit also supplies a second clock signal to the data reception circuit;
wherein the data transmission circuit comprises:
a pattern generation circuit generating a data pattern for a jitter resistance test, and
transmission circuitry allowing the data pattern generated by the pattern generation circuit to be transmitted in sync with the first clock signal, and
wherein the data reception circuit comprises:
reception circuitry allowing the data pattern transmitted by the transmission circuitry to be received in sync with the second clock signal, and
a pattern comparison circuit comparing the data pattern received by the reception circuitry with an expectation value to output a comparison result, and
a jitter generator control circuit controlling the jitter generator to vary an amount of modulation or the frequency of the jitter in accordance with the comparison result delivered by the pattern comparison circuit and a measurement procedure for the jitter resistance test.

2. The I/O interface circuit according to claim 1, wherein the jitter generator control circuit controls the jitter generator so as to vary the amount of modulation of the jitter when the comparison result delivered by the pattern comparison circuit indicates a match and to vary the frequency of the jitter when the comparison result delivered by the pattern comparison circuit indicates a mismatch.

3. An I/O interface circuit comprising:
a clock generation circuit generating a first clock signal;
a jitter generator generating jitter in the first clock signal based on a setting signal, which sets a present condition of the jitter;
a data transmission circuit transmitting data in sync with the first clock signal including the jitter; and
a data reception circuit receiving the transmitted data, wherein the clock generation circuit also supplies a second clock signal to the data reception circuit;
wherein the data transmission circuit comprises:
a pattern generation circuit generating a data pattern for a jitter resistance test, and
transmission circuitry allowing the data pattern generated by the pattern generation circuit to be transmitted in sync with the first clock signal,
wherein the data reception circuit comprises:
reception circuitry allowing the data pattern transmitted by the transmission circuitry to be received in sync with the second clock signal, and
a pattern comparison circuit comparing the data pattern received by the reception circuitry with an expectation value to output a comparison result, and
wherein
the pattern generation circuit in the data transmission circuit comprises:
a circuit including data of a contiguous sequence of 0s or 1s in the data pattern, and
the pattern comparison circuit in the data reception circuit comprises
a first circuit detecting the data of the contiguous sequence of 0s or 1s having been received, and
a second circuit forcing the comparison result to indicate a match when the first circuit detects the data of the contiguous sequence of 0s or 1s having been received.

4. The I/O interface circuit according to claim 3, wherein the pattern generation circuit in the data transmission circuit replaces part of the data pattern with the data of the contiguous sequence of 0s or 1s, thereby allowing the data pattern to include the data of the contiguous sequence of 0s or 1s.

5. The I/O interface circuit according to claim 3, wherein the pattern generation circuit in the data transmission circuit inserts the data of the contiguous sequence of 0s or 1s into a midpoint of the data pattern, thereby allowing the data pattern to include the data of the contiguous sequence of 0s or 1s.

6. The I/O interface circuit according to claim 3, wherein the pattern generation circuit in the data transmission circuit further comprises a circuit adjusting a cycle in a case of the data of the contiguous sequence of 0s or 1s being included in the data pattern in that cycle.

* * * * *